(12) United States Patent
Kim et al.

(10) Patent No.: US 12,048,158 B2
(45) Date of Patent: Jul. 23, 2024

(54) VERTICAL MEMORY DEVICES AND METHODS OF MANUFACTURING THE SAME

(71) Applicant: Samsung Electronics Co., Ltd., Suwon-si (KR)

(72) Inventors: Bio Kim, Seoul (KR); Yujin Kim, Suwon-si (KR); Philouk Nam, Suwon-si (KR); Youngseon Son, Hwaseong-si (KR); Kyongwon An, Seoul (KR); Jumi Yun, Pocheon-si (KR); Woojin Jang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 252 days.

(21) Appl. No.: 17/722,736

(22) Filed: Apr. 18, 2022

(65) Prior Publication Data

US 2022/0238555 A1 Jul. 28, 2022

Related U.S. Application Data

(62) Division of application No. 16/848,035, filed on Apr. 14, 2020, now Pat. No. 11,329,063.

(30) Foreign Application Priority Data

Jul. 30, 2019 (KR) .......................... 10-2019-0092525

(51) Int. Cl.
*H10B 43/27* (2023.01)
*H01L 21/02* (2006.01)
(Continued)

(52) U.S. Cl.
CPC ....... *H10B 43/27* (2023.02); *H01L 21/02249* (2013.01); *H01L 29/40114* (2019.08);
(Continued)

(58) Field of Classification Search
CPC ............................... H10B 43/27; H10B 43/20
See application file for complete search history.

(56) References Cited

U.S. PATENT DOCUMENTS 8,877,590 B1 11/2014 Lee
8,933,501 B2 1/2015 Makala et al.
(Continued)

FOREIGN PATENT DOCUMENTS

KR 10-2017-0029795 A 3/2017
KR 10-2017-0090045 A 8/2017
(Continued)

OTHER PUBLICATIONS

Korean Office Action dated Dec. 7, 2023 issued in Korean Patent Application No. 10-2019-0092525.
(Continued)

*Primary Examiner* — Christopher A Johnson
(74) *Attorney, Agent, or Firm* — Harness, Dickey & Pierce, P.L.C.

(57) ABSTRACT

A vertical memory device includes a channel extending in a vertical direction on a substrate, a charge storage structure on an outer sidewall of the channel and including a tunnel insulation pattern, a charge trapping pattern, and a first blocking pattern sequentially stacked in a horizontal direction, and gate electrodes spaced apart from each other in the vertical direction, each of which surrounds the charge storage structure. The charge storage structure includes charge trapping patterns, each of which faces one of the gate electrodes in the horizontal direction. A length in the vertical direction of an inner sidewall of each of the charge trapping patterns facing the tunnel insulation pattern is less than a length in the vertical direction of an outer sidewall thereof facing the first blocking pattern.

20 Claims, 30 Drawing Sheets

(51) Int. Cl.
  *H01L 21/28* (2006.01)
  *H01L 29/423* (2006.01)
  *H10B 41/27* (2023.01)
  *H10B 41/35* (2023.01)
  *H10B 43/35* (2023.01)

(52) U.S. Cl.
  CPC .. *H01L 29/40117* (2019.08); *H01L 29/42324* (2013.01); *H01L 29/4234* (2013.01); *H10B 41/27* (2023.02); *H10B 41/35* (2023.02); *H10B 43/35* (2023.02)

(56) References Cited

U.S. PATENT DOCUMENTS

| | | | |
|---|---|---|---|
| 9,431,409 B2 | 8/2016 | Lee et al. | |
| 9,812,463 B2 | 11/2017 | Sharangpani et al. | |
| 9,905,568 B2 | 2/2018 | Son et al. | |
| 9,953,995 B2 | 4/2018 | Walker | |
| 10,229,928 B2 | 3/2019 | Sun et al. | |
| 2016/0343730 A1 | 11/2016 | Son et al. | |
| 2017/0062471 A1* | 3/2017 | Son | H10B 43/27 |
| 2017/0125439 A1 | 5/2017 | Choi et al. | |
| 2017/0221921 A1 | 8/2017 | Kanamori et al. | |
| 2018/0033799 A1 | 2/2018 | Kanamori et al. | |
| 2018/0142151 A1 | 5/2018 | Lee et al. | |
| 2019/0139983 A1 | 5/2019 | Lee et al. | |
| 2019/0157290 A1* | 5/2019 | Jhang | H01L 21/02178 |
| 2019/0198509 A1 | 6/2019 | Kim | |
| 2019/0273092 A1* | 9/2019 | Sasaki | G11C 8/10 |
| 2020/0144288 A1 | 5/2020 | Kanamori et al. | |

FOREIGN PATENT DOCUMENTS

| | | |
|---|---|---|
| KR | 10-2018-0012640 A | 2/2018 |
| KR | 10-2018-0058610 A | 6/2018 |
| KR | 10-2019-0009937 A | 1/2019 |
| KR | 10-2019-0058079 A | 5/2019 |

OTHER PUBLICATIONS

German Office Action dated Nov. 18, 2021 issued in corresponding German Patent Application No. 10 2020 110 361.1.
Singaporean Search Report dated Sep. 28, 2023 issued in Singaporean Patent Application No. 10202004783V.
Indian Examination Report dated Mar. 21, 2024 issued in Indian Patent Application No. 202024016568.

\* cited by examiner

VERTICAL MEMORY DEVICES AND METHODS OF MANUFACTURING THE SAME

CROSS-REFERENCE TO RELATED APPLICATIONS

This application is a divisional of U.S. application Ser. No. 16/848,035, filed on Apr. 14, 2020, which claims priority under 35 USC § 119 to Korean Patent Application No. 10-2019-0092525, filed on Jul. 30, 2019 in the Korean Intellectual Property Office (KIPO), the contents of each of which are herein incorporated by reference in their entirety.

BACKGROUND

Inventive concepts relate to a vertical memory device and/or a method of manufacturing the same.

In a VNAND flash memory device, a charge trapping layer on an outer sidewall of a vertical channel may extend in a vertical direction, and thus charges trapped in the charge trapping layer may be moved in the vertical direction by a plurality of gate electrodes at a plurality of levels, respectively. As a result, a retention characteristic of the VNAND flash memory device may deteriorate, which may cause reliability problems.

SUMMARY

Some example embodiments provide a vertical memory device having improved characteristics.

Some example embodiments provide a method of manufacturing a vertical memory device having improved characteristics.

According to some example embodiments, there is provided a vertical memory device including a channel on a substrate, the channel extending in a vertical direction that is perpendicular to an upper surface of the substrate, a charge storage structure on an outer sidewall of the channel, the charge storage structure including a tunnel insulation pattern, a charge trapping pattern, and a first blocking pattern that are sequentially stacked in a horizontal direction, the horizontal direction parallel to the upper surface of the substrate, and gate electrodes spaced apart from each other in the vertical direction, each of the gate electrodes surrounding the charge storage structure. The charge storage structure includes charge trapping patterns spaced apart from each other in the vertical direction, each of the charge trapping patterns facing one of the gate electrodes in the horizontal direction. A first length in the vertical direction of an inner sidewall of at least one of the charge trapping patterns facing the tunnel insulation pattern is less than a second length in the vertical direction of an outer sidewall of a respective at least one of the charge trapping patterns facing the first blocking pattern.

According to some example embodiments, there is provided a vertical memory device including a channel on a substrate, the channel extending in a vertical direction that is perpendicular to an upper surface of the substrate, a charge storage structure on an outer sidewall of the channel, the charge storage structure including a tunnel insulation pattern, a charge trapping pattern structure, and a blocking pattern that are sequentially stacked in a horizontal direction parallel to the upper surface of the substrate, and gate electrodes spaced apart from each other in the vertical direction, each of the gate electrodes surrounding the charge storage structure. The charge storage structure includes charge trapping pattern structures spaced apart from each other in the vertical direction, each of the charge trapping pattern structures facing a corresponding one of the gate electrodes in the horizontal direction. Each of the charge trapping pattern structures includes first and second charge trapping patterns that are sequentially stacked in the horizontal direction on an outer sidewall of the tunnel insulation pattern, the first and second trapping patterns including different materials from each other.

According to some example embodiments, there is provided a vertical memory device including.

According to some example embodiments, there is provided a vertical memory device including a channel on a substrate, the channel extending in a vertical direction perpendicular to an upper surface of the substrate, a charge storage structure on an outer sidewall of the channel, the charge storage structure including a tunnel insulation pattern, a charge trapping pattern, and a blocking pattern that are sequentially stacked in a horizontal direction parallel to the upper surface of the substrate, a dummy charge storage structure spaced apart from the charge storage structure in the vertical direction on the substrate, the dummy charge storage structure including a dummy tunnel insulation pattern, a dummy charge trapping pattern, and a dummy blocking pattern that are sequentially stacked, and gate electrodes spaced apart from each other in the vertical direction, each of the gate electrodes surrounding the charge storage structure. The charge storage structure includes charge trapping patterns spaced apart from each other in the vertical direction, each of the charge trapping patterns facing a corresponding one of the gate electrodes in the horizontal direction. The dummy tunnel insulation pattern and the dummy blocking pattern include materials substantially the same as those of the tunnel insulation pattern and the blocking pattern, respectively, and the dummy charge trapping pattern includes a material different from that of the charge trapping patterns.

According to some example embodiments, there is provided a vertical memory device including channels on a substrate, each of the channels extending in a first direction perpendicular to an upper surface of the substrate, a channel connection pattern on the substrate, the channel connection pattern contacting the channels, a charge storage structure on outer sidewalls of the channels on the channel connection pattern, the charge storage structure including a tunnel insulation pattern, a charge trapping pattern, a blocking pattern and a division pattern, the tunnel insulation pattern, the charge trapping pattern, and the blocking pattern sequentially stacked in a horizontal direction parallel to the upper surface of the substrate, gate electrodes spaced apart from each other in the first direction, each of the gate electrodes surrounding the charge storage structure, division structures on the substrate, each of the division structures extending through the gate electrodes in a second direction parallel to the upper surface of the substrate, the division structures dividing each of the gate electrodes in a third direction, the third direction parallel to the upper surface of the substrate and crossing the second direction, and bit lines on the channels, each of the bit lines extending in the third direction to electrically connect to the channels. The charge storage structure includes charge trapping patterns spaced apart from each other in the first direction, each of the charge trapping patterns facing one of the gate electrodes in the horizontal direction. A first length in the first direction of an inner sidewall of each of the charge trapping patterns facing the tunnel insulation pattern is less than a second length in the first direction of an outer sidewall of each of the charge trapping patterns facing the blocking pattern. The division pattern is between ones of the charge trapping patterns that neighbor in the first direction, the division pattern contacting the tunnel insulation pattern and the blocking pattern, the division pattern including an insulating material.

According to some example embodiments, there is provided a method of fabricating a vertical memory device including forming a mold on a substrate, the mold including an insulation layer and a first sacrificial layer that are alternately and repeatedly stacked, forming a channel and a preliminary charge storage structure on the substrate, the channel extending through the mold, and the preliminary charge storage structure covering an outer sidewall of the channel and including a tunnel insulation pattern, a preliminary charge trapping pattern, and a first blocking pattern that are sequentially stacked, forming an opening through the mold to expose an upper surface of the substrate, removing the first sacrificial layer through the opening to form a first gap exposing an outer sidewall of the preliminary charge storage structure, performing a first nitridation process on the preliminary charge trapping pattern through the first gap to form charge trapping patterns spaced apart from each other in a vertical direction that is perpendicular to the upper surface of the substrate, performing a first oxidation process on the preliminary charge trapping pattern through the first gap to form a division pattern between the charge trapping patterns, and forming a gate electrode in the first gap.

According to some example embodiments, there is provided a method of fabricating a vertical memory device including forming a mold on a substrate, the mold including an insulation layer and a sacrificial layer that are alternately and repeatedly stacked, forming a channel and a preliminary charge storage structure on the substrate, the channel extending through the mold, and the preliminary charge storage structure covering an outer sidewall of the channel and including a tunnel insulation pattern, a preliminary charge trapping pattern, and a first blocking pattern that are sequentially stacked, forming an opening through the mold to expose an upper surface of the substrate, removing the sacrificial layer through the opening to form a gap exposing an outer sidewall of the preliminary charge storage structure, performing a first nitridation process on the preliminary charge trapping pattern through the gap to form oxidation reduction patterns spaced apart from each other in a vertical direction that is perpendicular to the upper surface of the substrate, performing a first oxidation process on the preliminary charge trapping pattern through the gap to form a preliminary division pattern between the oxidation reduction patterns, performing a second oxidation process on the oxidation reduction patterns and the preliminary charge trapping pattern through the gap to divide the preliminary charge trapping pattern into a plurality of pieces spaced apart from each other in the vertical direction, performing a second nitridation process on each of the preliminary charge trapping patterns through the gap to form a charge trapping pattern at lower and upper ends and an outer sidewall of each of the preliminary charge trapping patterns, and forming a gate electrode in the gap.

In the method of manufacturing the vertical memory device in accordance with some example embodiments, a nitridation process and/or an oxidation process may be performed on the preliminary charge trapping pattern extending in the vertical direction, to more easily form a plurality of charge trapping patterns spaced apart from each other in the vertical direction. Thus, charges trapped in the charge trapping patterns may not move in the vertical direction, or may move a reduced amount in the vertical direction, by gate electrodes at other levels, so that the retention characteristics may be enhanced. Accordingly, the vertical memory device including the charge trapping patterns may have enhanced reliability and/or enhanced retention characteristics.

DETAILED DESCRIPTION OF EXAMPLE EMBODIMENTS

The above and other aspects and features of the vertical memory devices and/or the methods of manufacturing the same in accordance with some example embodiments will become readily understood from detail descriptions that follow, with reference to the accompanying drawings. Hereinafter in the specifications (not necessarily in the claims), a direction substantially perpendicular to an upper surface of a substrate may be defined as a first direction, and two directions substantially parallel to the upper surface of the substrate and crossing each other may be defined as second and third directions, respectively. In some example embodiments, the second and third directions may be substantially perpendicular to each other.

Figure 1:
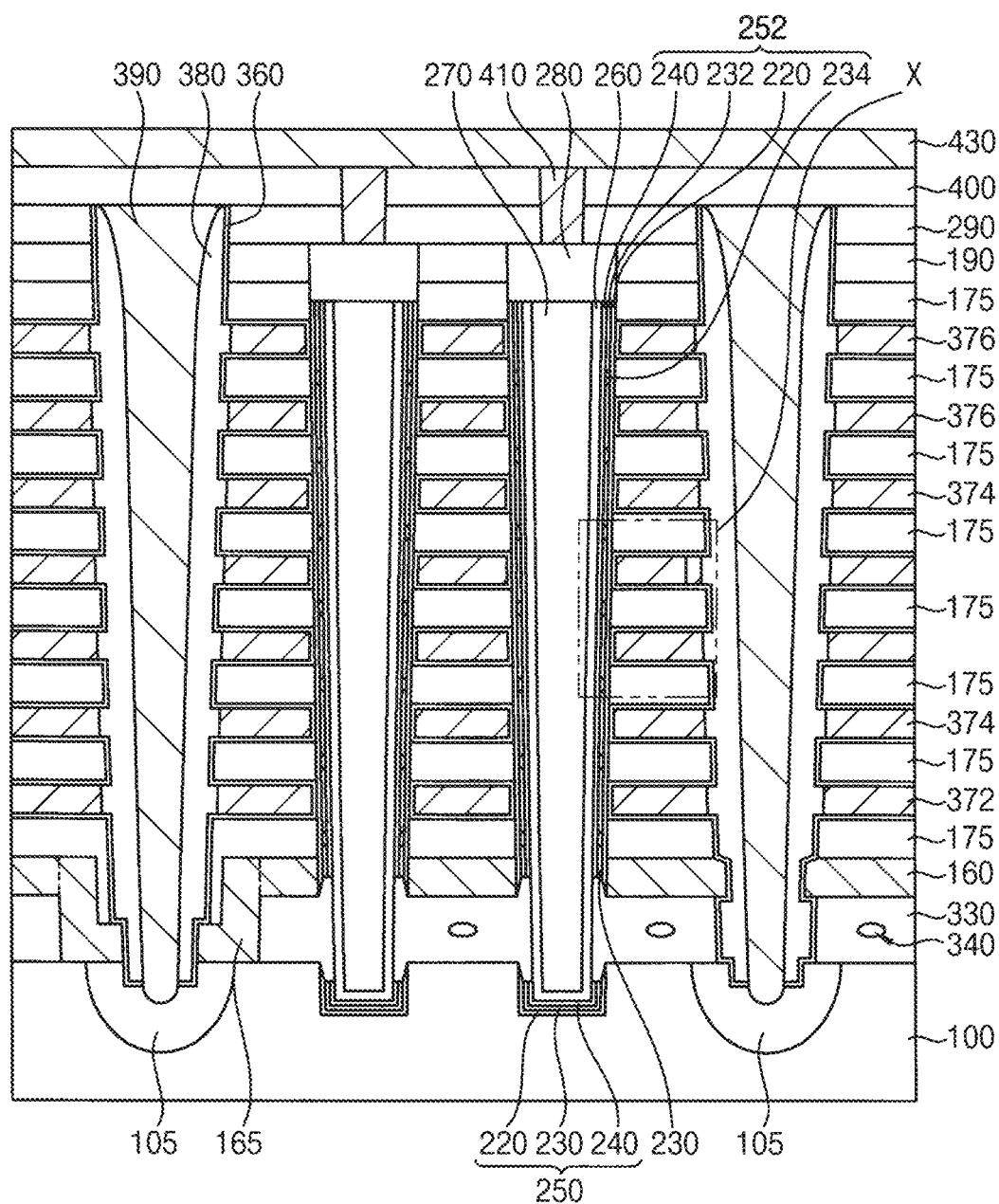
FIGS. 1 and 2 are cross-sectional views illustrating a vertical memory device in accordance with some example embodiments.
Figure 2:
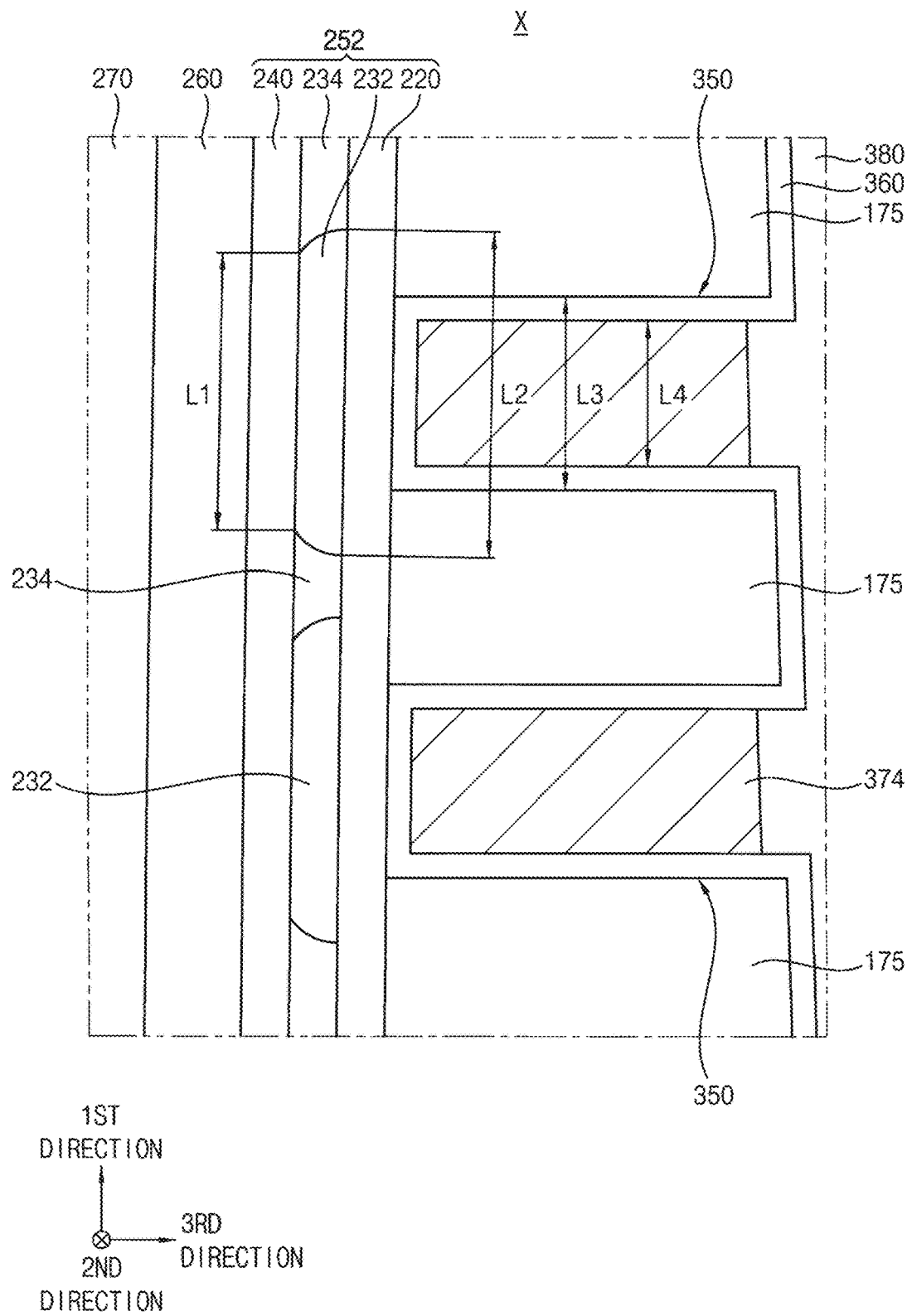

FIGS. 1 and 2 are cross-sectional views illustrating a vertical memory device in accordance with some example embodiments. FIG. 2 is an enlarged cross-sectional view of a region X of FIG. 1.

Referring to FIGS. 1 and 2, the vertical memory device may include a channel 260, a first charge storage structure 252, and a gate electrode structure on a substrate 100. The vertical memory device may further include a dummy charge storage structure 250, a channel connection pattern 330, an insulation pattern 175, a second blocking pattern 360, a common source pattern (CSP) 390, a second spacer 380, a support layer 160, a support pattern 165, a filling pattern 270, a pad 280, first to third insulating interlayers 190, 290 and 400, a contact plug 410, and a bit line 430.

The substrate 100 may be or include a wafer, and may include silicon, germanium, silicon-germanium or a III-V compound such as GaP, GaAs, GaSb, etc. In some example embodiments, the substrate 100 may be or include a silicon-on-insulator (SOI) substrate or a germanium-on-insulator (GOI) substrate. For example, n-type impurities may be doped into the substrate 100.

The channel 260 may extend in the first direction on the substrate 100, and may have, e.g., a cup-like shape. The channel 260 may include polysilicon, e.g., undoped polysilicon.

In some example embodiments, the channel 260 may be formed in each of the second and third directions to form a channel array. The CSP 390 and the second spacer 380 on each of opposite sidewalls of the CSP 390 in the third direction may form a division structure, and the channels 260 surrounded by the gate electrode structure between ones of the division structures that neighbor each other in the third direction may form a channel block. The channel array may include a plurality of channel blocks arranged in the third direction. The channels 260 included in each of the channel blocks may be connected with each other by the channel connection pattern 330.

The channel connection pattern 330 may extend in the second direction between neighboring ones of the division structures in the third direction to contact a lower outer sidewall of each of the channels 260, and a plurality of channel connection patterns 330 may be formed in the third direction. The channel connection pattern 330 may include, e.g., undoped polysilicon or polysilicon doped with impurities such as p-type and/or n-type impurities. An air gap 340 may be formed in the channel connection pattern 330.

The first charge storage structure 252 may be formed on the channel connection pattern 330 to cover an outer sidewall of a portion of the channel 260 extending through the gate electrode structure, and the dummy charge storage structure 250 may be formed between an upper surface of the substrate 100 and the channel connection pattern 330 to cover a bottom surface and an outer sidewall of a lower end of the channel 260. For example, the first charge storage structure 252 and the dummy charge storage structure 250 may be spaced apart from each other in the first direction by the channel connection pattern 330 contacting a lower sidewall of the channel 260. A lower surface of the first charge storage structure 252 and an upper surface of the dummy charge storage structure 250 may contact the channel connection pattern 330.

The first charge storage structure 252 may include a tunnel insulation pattern 240, a charge trapping pattern 232, and a first blocking pattern 220 that are sequentially stacked in a horizontal direction. The horizontal direction may be substantially parallel to the upper surface of the substrate 100. The tunnel insulation pattern 240, the charge trapping pattern 232, and the first blocking pattern 220 may be sequentially stacked from an outer sidewall of the channel 260. The first charge storage structure 252 may further include a division pattern 234. Each of the tunnel insulation pattern 240 and the first blocking pattern 220 may include an oxide, e.g., silicon oxide, and the charge trapping pattern 232 may include a nitride, e.g., silicon nitride. The charge trapping pattern 232 may not include an oxide, and either or both of the tunnel insulation pattern 240 and the first blocking pattern 220 may not include a nitride.

The gate electrode structure may include the gate electrodes 372, 374, and 376 stacked at a plurality of levels, respectively, spaced apart from each other in the first direction, and the insulation pattern 175 may be formed between neighboring ones of the gate electrodes 372, 374, and 376. The insulation pattern 175 may include an oxide, e.g., silicon oxide. Each of the gate electrodes 372, 374 and 376 may surround the channels 260 and the first charge storage structures 252 covering the outer sidewall of the channels 260, respectively, between neighboring ones of the division structures in the third direction.

In some example embodiments, the gate electrode structure may include at least one first gate electrode 372, a plurality of second gate electrodes 374, or at least one third gate electrode 376 sequentially stacked in the first direction. The first gate electrode may serve as a ground selection line (GSL), each of the second gate electrodes 374 may serve as a word line, and the third gate electrode 376 may serve as a string selection line (SSL).

In the third direction, a plurality of gate electrode structures may be formed to be spaced apart from each other by the division structures. In some example embodiments, the gate electrode structure may form a staircase structure of which a length in the second direction may decrease from a lowermost level toward an uppermost level in the first direction.

Each of the first to third gate electrodes 372, 374, and 376 may include a gate conductive pattern and a gate barrier pattern covering a surface of the gate conductive pattern. The gate conductive pattern may include a low resistance metal, e.g., at least one of tungsten, titanium, tantalum, platinum, etc., and the gate barrier pattern may include a metal nitride, e.g., at least one of titanium nitride, tantalum nitride, etc.

Upper and lower surfaces and a sidewall facing the first charge storage structure 252 of each of the first to third gate electrodes 372, 374, and 376 may be covered by the second blocking pattern 360, and the second blocking pattern 360 may extend in the first direction to cover a sidewall of the insulation pattern 175 between the first to third gate electrodes 372, 374 and 376. The second blocking pattern 360 may include a metal oxide, e.g., aluminum oxide.

In some example embodiments, each of the tunnel insulation pattern 240 and the first blocking pattern 220 included in the first charge storage structure 252 may extend in the first direction through the gate electrode structure, and a plurality of charge trapping patterns 232 may be spaced apart from each other in the first direction to face the gate electrodes 372, 374 and 376, respectively, in the horizontal direction.

However, a minimum length L1 in the first direction of each of the charge trapping patterns 232 may be greater than that a third length L3 in the first direction of each of second gaps 350 for forming the gate electrodes 372, 374, and 376, respectively, between the insulation patterns 175. One of the gate electrodes 372, 374, and 376 and the second blocking pattern 360 may be formed in each of the second gaps 350, and thus the first length L1 may be greater than a fourth length L4 in the first direction of each of the gate electrodes 372, 374 and 376.

In some example embodiments, a length in the first direction of each of the charge trapping patterns 232 may gradually increase from the tunnel insulation pattern 240 to the first blocking pattern 220. Thus, in each of the charge trapping patterns 232, the first length L1 of an inner sidewall contacting the tunnel insulation pattern 240 may be less than a second length L2 of an outer sidewall contacting the first blocking pattern 220. In some example embodiments, an absolute value of a slope of an upper surface or a lower surface of each of the charge trapping patterns 232 with respect to the upper surface of the substrate 100 may gradually decrease from the tunnel insulation pattern 240 to the first blocking pattern 220. The charge trapping patterns 232 may be concave, e.g. may be concave in the third direction from the tunnel insulation pattern 240 to the first blocking pattern 220.

The division pattern 234 may be formed between neighboring ones of the charge trapping patterns 232 in the first direction, and thus the charge trapping patterns 232 may be spaced apart from each other. The division pattern 234 may face the insulation pattern 175 in the horizontal direction, more particularly, may face a central portion in the first direction of the insulation pattern 175, e.g. with the first blocking pattern 220 therebetween. The division pattern 234 may include an oxide, e.g., silicon oxide.

A length in the first direction of the division pattern 234 may be less than a length in the first direction of a corresponding one of the insulation patterns 175, and may gradually decrease from the tunnel insulation pattern 240 to the first blocking pattern 220. In some example embodiments, an absolute value of a slope of an upper surface or a lower surface of each of the division pattern 234 with respect to the upper surface of the substrate 100 may gradually decrease from the tunnel insulation pattern 240 to the first blocking pattern 220. The division pattern 234 may be convex, e.g. may be convex in the third direction from the tunnel insulation pattern 240 to the first blocking pattern 220.

In some example embodiments, bottom surfaces of the tunnel insulation pattern 240 and the charge trapping pattern 232 of the first charge storage structure 252 may be higher than a bottom surface of the first blocking pattern 220 of the first charge storage structure 252.

The dummy charge storage structure 250 may include the tunnel insulation pattern 240, a dummy charge trapping pattern 230, and the first blocking pattern 220 that are sequentially stacked from the channel 260. Hereinafter, the tunnel insulation pattern 240 and the first blocking pattern 220 of the dummy charge storage structure 250 may be referred to as a dummy tunnel insulation pattern and a dummy first blocking pattern, respectively, so as to be distinguished from those of the first charge storage structure 252. Thus, the dummy charge storage structure 250 may include the dummy tunnel insulation pattern 240, the dummy charge trapping pattern 230, and the dummy first blocking pattern 220 sequentially stacked. Each of the dummy tunnel insulation pattern 240 and the dummy first blocking pattern 220 may include an oxide, e.g., silicon oxide as that of the first charge storage structure 252.

The dummy charge trapping pattern 230 may include at least one of silicon, or silicon compounds, e.g., at least one of silicon carbonitride, silicon boronitride, silicon doped with carbon, silicon doped with nitrogen, etc.

Each of the dummy tunnel insulation pattern 240, the dummy charge trapping pattern 230, and the dummy first blocking pattern 220 included in the dummy charge storage structure 250 may have a single layered structure covering the bottom surface and the outer sidewall of the lower end of the channel 260.

In some example embodiments, an upper surface of the dummy charge storage structure 250 may have a shape corresponding to the lower surface of the first charge storage structure 252. Thus, upper surfaces of the dummy tunnel insulation pattern 240 and the dummy charge trapping pattern 230 of the dummy charge storage structure 250 may be lower than the upper surface of the first blocking pattern 220 of the dummy charge storage structure 250.

An inner space formed by the cup-like channel 260 may be filled with the filling pattern 270. The filling pattern 270 may include an oxide, e.g., silicon oxide.

The pad 280 may be formed on the channel 260, the first charge storage structure 252, and the filling pattern 270, and thus may be connected to the channel 260. The pad 280 may include polysilicon, e.g., undoped or doped polysilicon.

The CSP 390 may extend in the second direction, and may form the division structure together with the second spacer 380 on each of opposite sidewalls of the CSP 390 in the third direction to divide each of the gate electrodes 372, 374 and 376 in the third direction. A plurality of CSPs 390 may be spaced apart from each other in the third direction. The CSP 390 may include a metal, e.g., at least one of tungsten, copper, aluminum, etc.

As the second spacer 380 covers the sidewalls of the CSP 390, the CSP 390 may be electrically insulated from neighboring gate electrodes 372, 374 and 376. The second spacer 380 may include an oxide, e.g., silicon oxide.

An impurity region 105 may be formed at an upper portion of the substrate 100 contacting a bottom surface of the CSP 390. The impurity region 105 may include silicon, e.g., single crystalline silicon doped with n-type impurities such as phosphorus and/or arsenic. As the impurity region 105 is formed, the contact resistance between the CSP 390 and the substrate 100 may be reduced.

The support layer 160 may be formed on the channel connection pattern 330, and the support pattern 165 may be connected to the support layer 160 on the substrate 100. The support layer 160 may extend in the second direction between neighboring ones of the division structures in the third direction, and a plurality of support patterns 165 may be formed in each of the second and third directions. The support layer 160 and the support pattern 165 may include substantially the same material, e.g., doped or undoped polysilicon, and may be integrally formed with each other, e.g. may be formed at the same time.

The first to third insulating interlayers 190, 290, and 400 may include an oxide, e.g., silicon oxide, and thus may be merged with each other, e.g. may be homogenized with each other, e.g. may be homogenized with each other through a thermal process and/or other processing steps.

The contact plug 410 may extend through the second and third insulating interlayers 290 and 400 to contact an upper surface of the pad 280, and the bit line 430 may extend in the third direction to electrically connect to the contact plugs 410 arranged in the third direction. Thus, a current generated from a voltage applied by the bit line 430 may flow through the contact plug 410 and the pad 280 to the channel 260. In some example embodiments, a plurality of bit lines 430 may be formed to be spaced apart from each other in the second direction.

The contact plug 410 and the bit line 430 may include at least one of a metal, a metal nitride, a metal silicide, doped polysilicon, etc.

The vertical memory device may include the first charge storage structure 252 covering the outer sidewall of the portion of the channel 260 extending through the gate electrode structure, and the first charge storage structure 252 may include the charge trapping patterns 232 spaced apart from each other in the first direction by the division pattern 234 and facing one of the gate electrodes 372, 374, and 376 in the horizontal direction. Thus, charges trapped in each of the charge trapping patterns 232 may not move/be moved in the first direction by the gate electrodes 372, 374, and 376 at other levels, and the retention characteristic may be enhanced and/or improved. Accordingly, the vertical memory device including the first charge storage structure 252 may have improved reliability.

Figure 7:
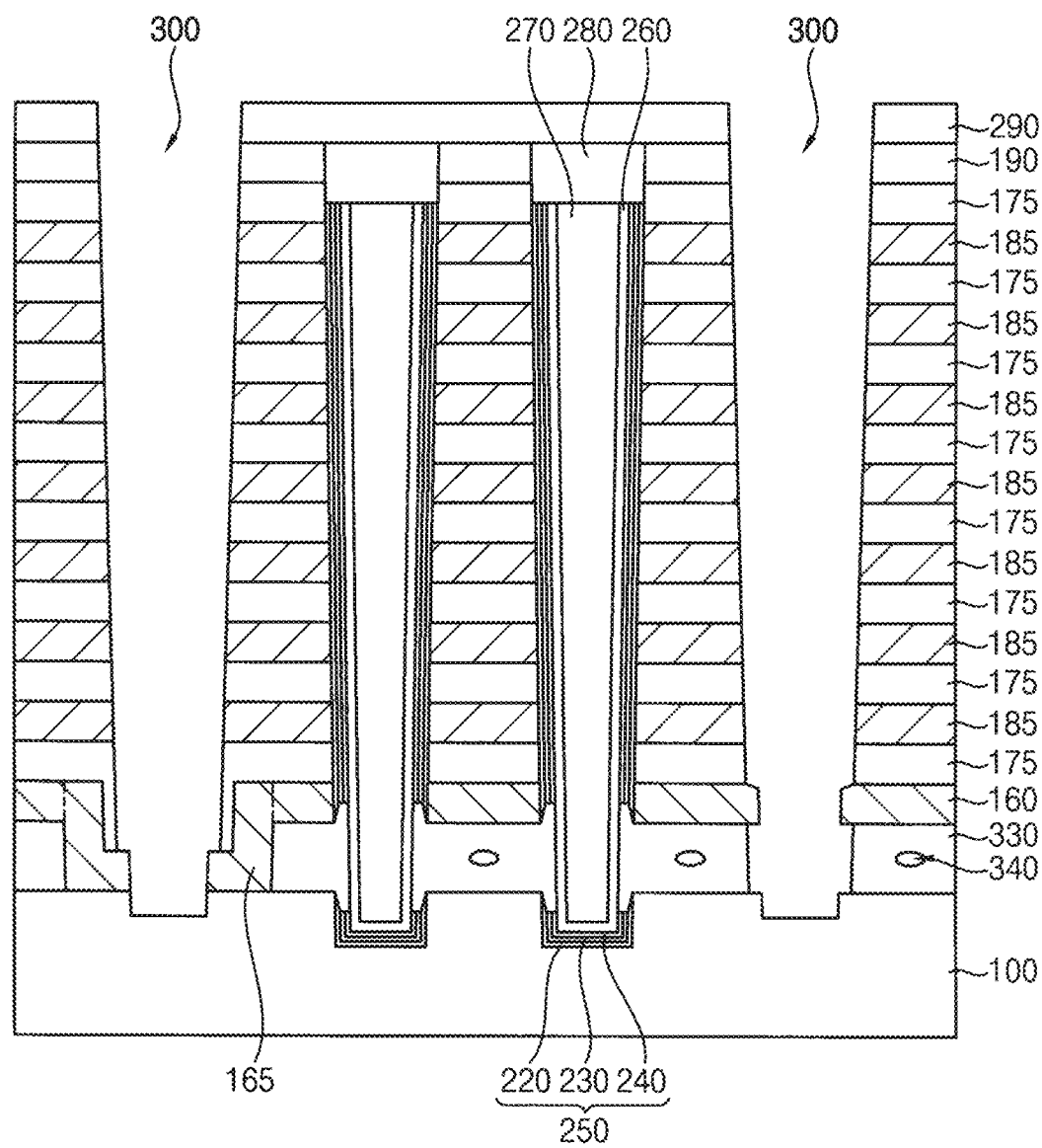
Figure 8:
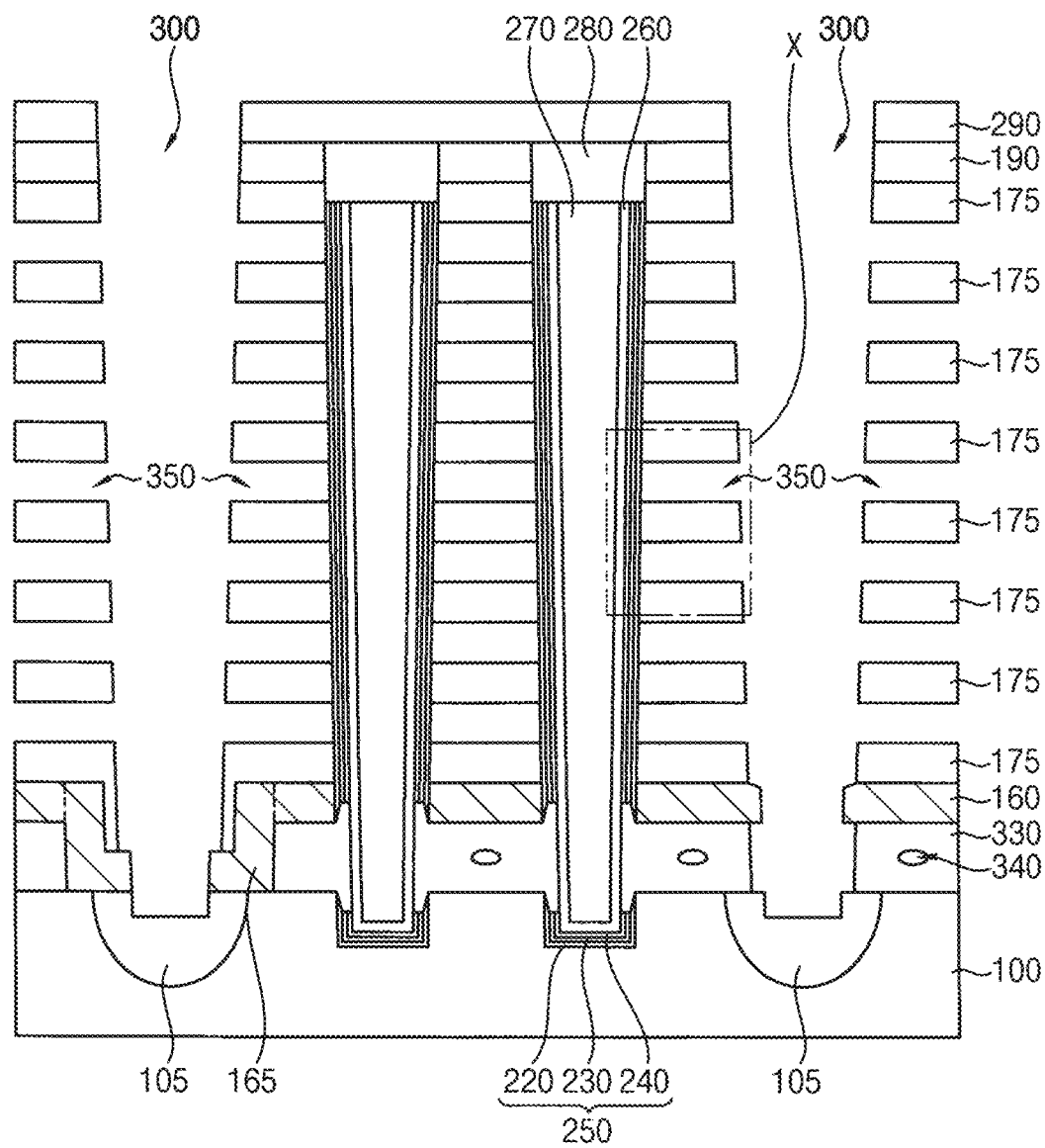
Figure 9:
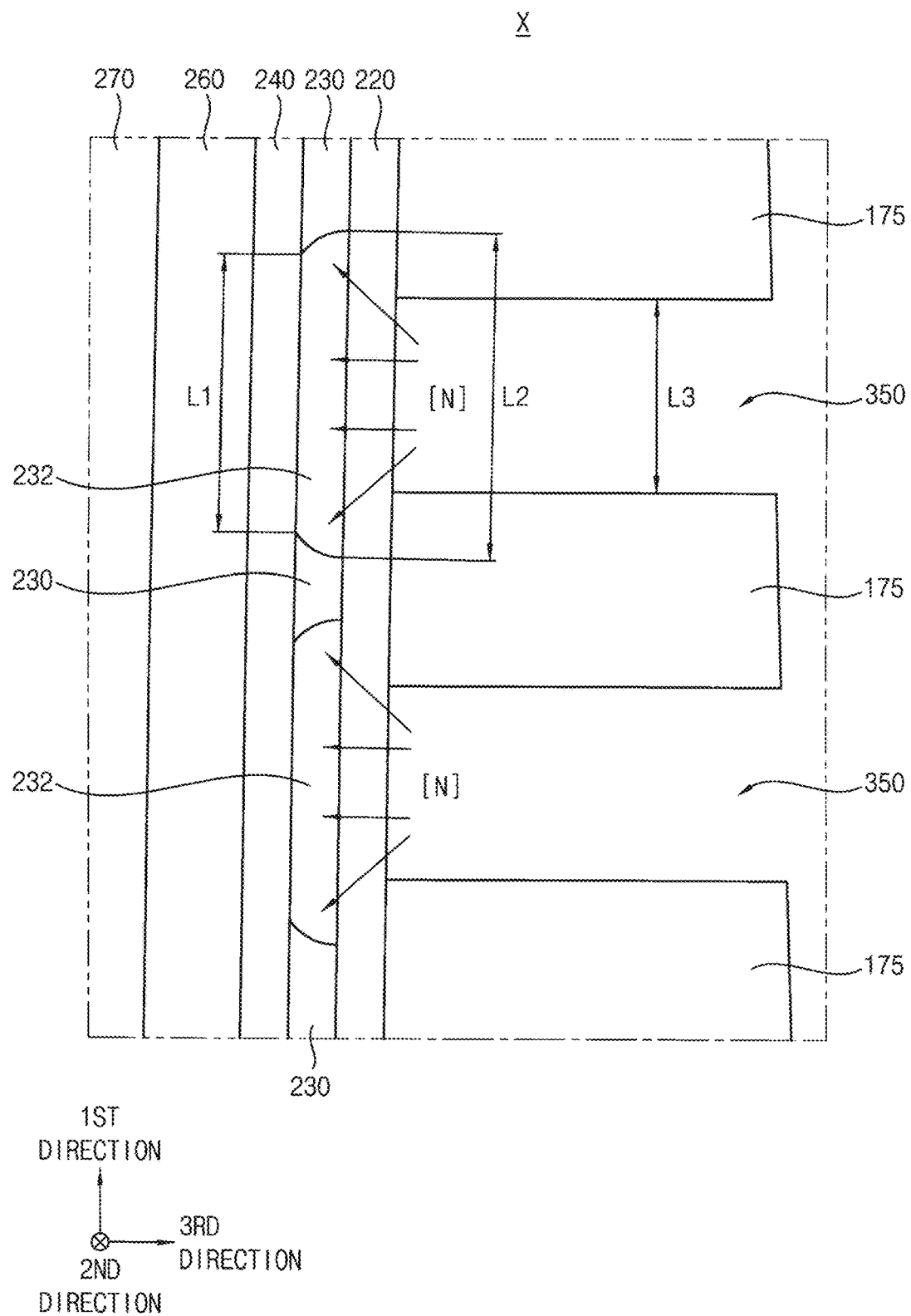
Figure 10:
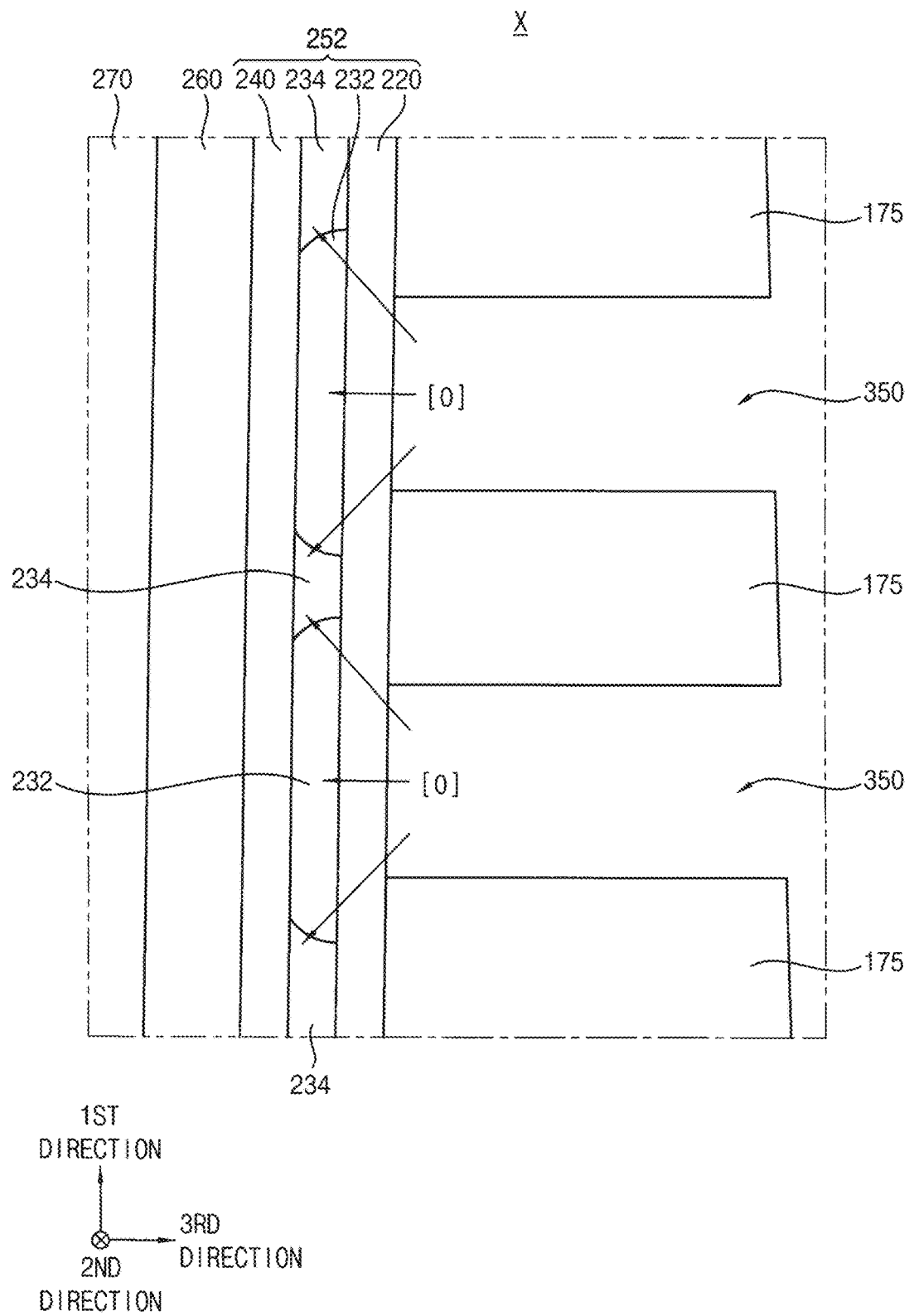

FIGS. 3 to 11 are cross-sectional views illustrating a method of manufacturing a vertical memory device in accordance with some example embodiments. FIGS. 9 and 10 are enlarged cross-sectional views of a region X of FIG. 8.

Figure 3:
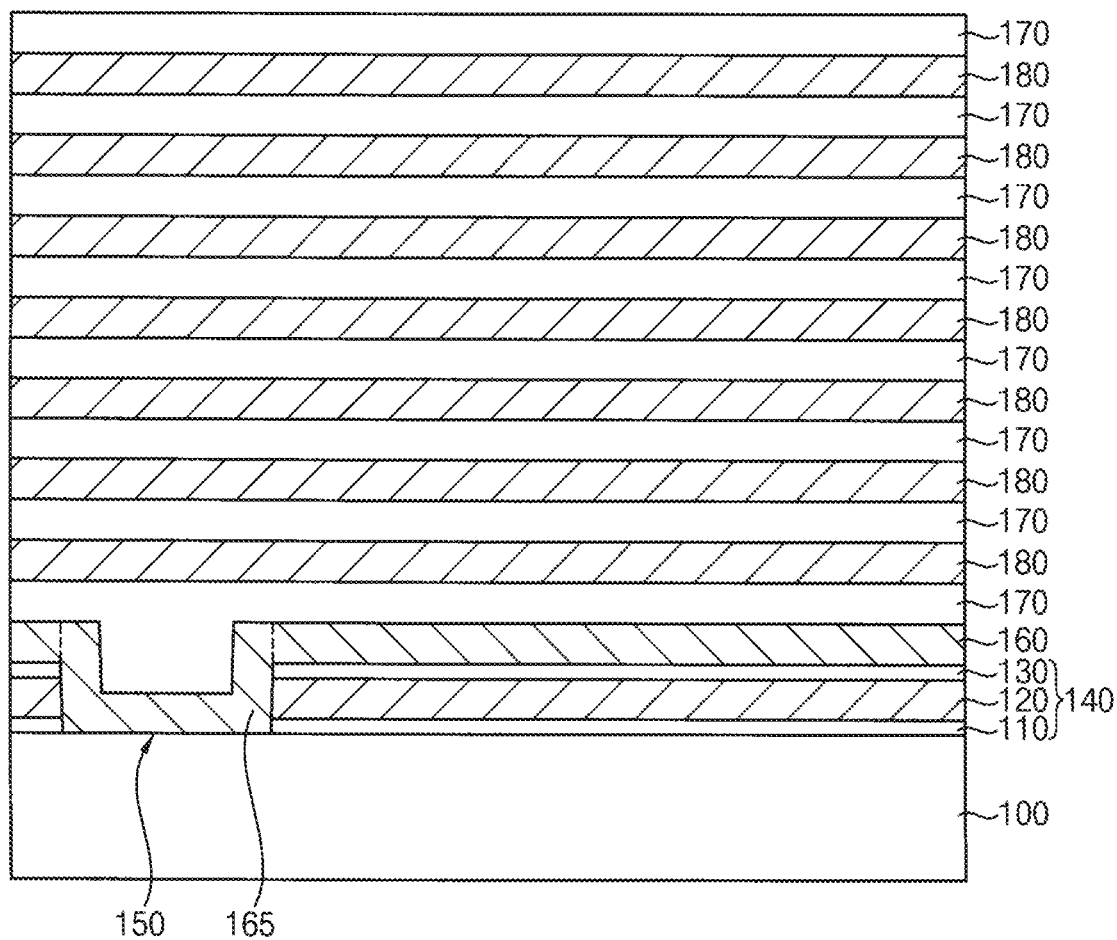
FIGS. 3 to 11 are cross-sectional views illustrating a method of manufacturing a vertical memory device in accordance with some example embodiments.

Referring to FIG. 3, a sacrificial layer structure 140 may be formed on a substrate 100, and may be partially removed to form a first opening 150 exposing an upper surface of the substrate 100. The sacrificial layer structure 140 may be formed with a chemical vapor deposition (CVD) process, such as an atomic layer deposition (ALD) and/or a plasma enhanced chemical vapor deposition (PECVD) process. A photolithography process may be used to form the first opening 150. A support layer 160 may be formed on the substrate 100 and the sacrificial layer structure 140 to at least partially fill the first opening 150. The support layer 160 may be formed with a suitable process such as a PECVD process.

The sacrificial layer structure 140 may include first to third sacrificial layers 110, 120 and 130 sequentially stacked in the first direction on the substrate 100. Each of the first and third sacrificial layers 110 and 130 may include an oxide, e.g., silicon oxide, and the second sacrificial layer 120 may include a nitride, e.g., silicon nitride. Each of the first through third sacrificial layers 110, 120, and 130 may be formed at the same time.

The support layer 160 may include a material having an etching selectivity with respect to the first to third sacrificial layers 110, 120 and 130. For example, the support layer 160 may be formed of or include doped or undoped polysilicon. In some example embodiments, the support layer 160 may be formed by depositing doped or undoped amorphous silicon, and by performing a heat treatment or by being crystallized through heat generated during the deposition process for other structures to include doped or undoped polysilicon. The support layer 160 may be deposited with a CVD process.

The support layer 160 may be conformally deposited. The support layer 160 may have a uniform thickness, and thus a first recess may be formed on a portion of the support layer 160 in the first opening 150. Hereinafter, the portion of the support layer 160 in the first opening 150 may be referred to as a support pattern 165.

An insulation layer 170 may be formed on the support layer 160 to fill the first recess, and an upper portion of the insulation layer 170 may be planarized. The planarization process may include a chemical mechanical polishing (CMP) process and/or an etch back process.

A fourth sacrificial layer 180 and the insulation layer 170 may be alternately and repeatedly formed on the insulation layer 170, and thus a mold layer may be formed on the substrate 100. Each layer of the fourth sacrificial layer 180 and the insulation layer 170 may be formed simultaneously; however, inventive concepts are not limited thereto. Furthermore, although eight layers of the fourth sacrificial layer 180 and the insulation layer 170 are illustrated in FIG. 3, inventive concepts are not limited thereto, and the number of layers of the fourth sacrificial layer 180 and the insulation layer 170 that are alternately stacked may be an integer more than 8 or less than 8. The fourth sacrificial layer 180 may include a material having an etching selectivity with respect to the insulation layer 170, e.g., a nitride such as silicon nitride.

A patterning process using a photoresist pattern (not shown) as an etching mask may be performed on the insulation layer 170 and the fourth sacrificial layer 180, and a trimming process for reducing an area of the photoresist pattern may be also performed. The patterning process and the trimming process may be alternately and repeatedly performed to form a mold having a plurality of step layers each including the fourth sacrificial layer 180 and the insulation layer 170 sequentially stacked on the substrate 100.

Figure 4:
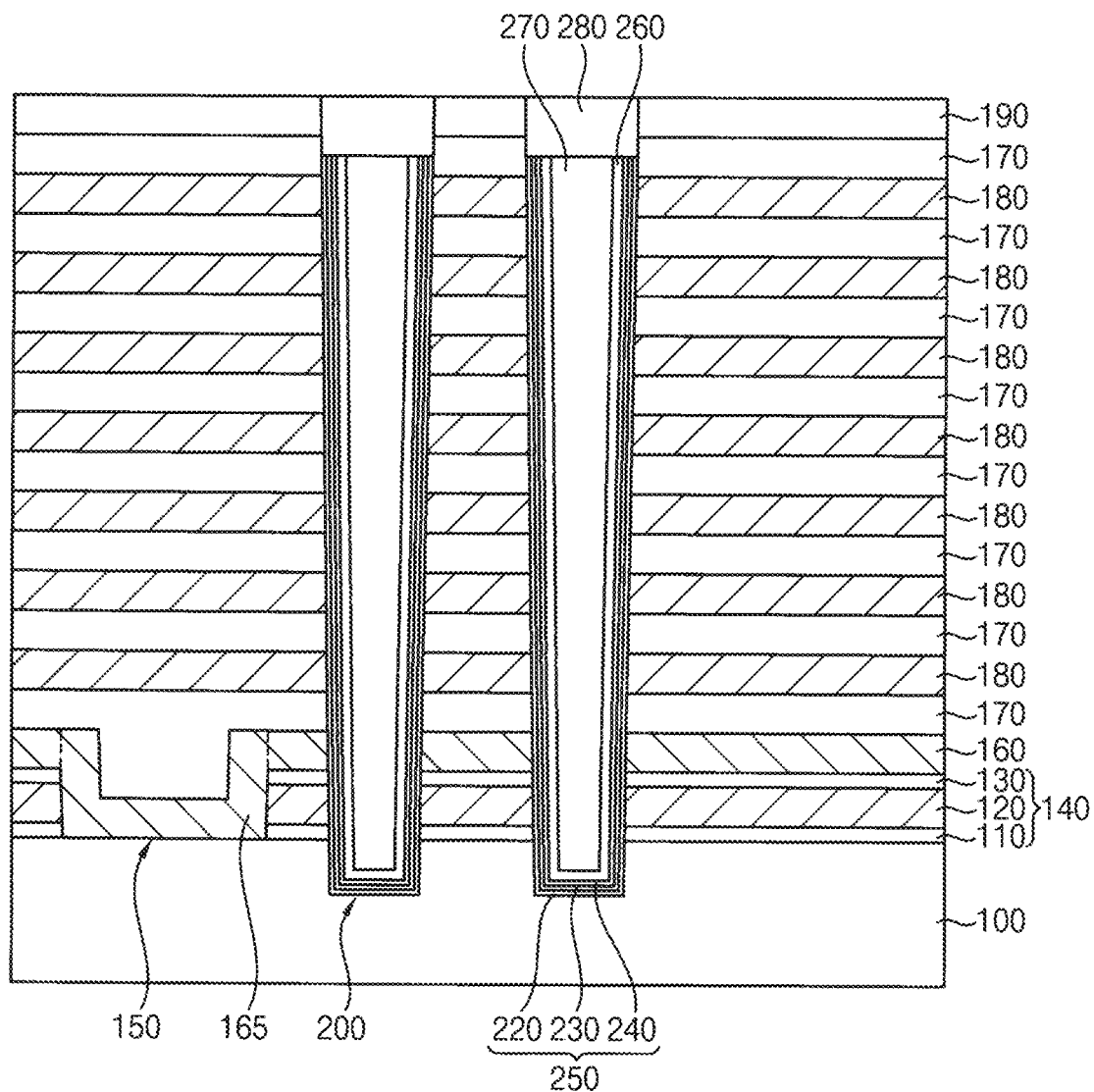
Figure 4:
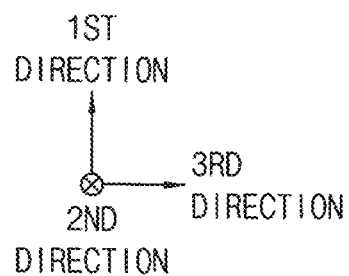

Referring to FIG. 4, a first insulating interlayer 190 may be formed on an uppermost one of the insulation layers 170, and a channel hole 200 may be formed through the first insulating interlayer 190 and the mold to expose an upper surface of the substrate 100 by a dry etching process, e.g. by a dry etching process, such as a reactive ion etching (RIE) process, capable of etching a high aspect ratio hole.

In some example embodiments, the dry etching process may be performed until the upper surface of the substrate 100 may be exposed, and an upper portion of the substrate 100 may be further removed in the dry etching process. In some example embodiments, a plurality of channel holes 200 may be formed in each of the second and third directions, and thus a channel hole array may be defined.

A preliminary charge storage structure 250, a channel 260, a filling pattern 270, and a pad 280 may be formed in the channel hole 200. The preliminary charge storage structure 350, the channel 260, and the filling pattern 270 may be formed in-situ, at the same time, with an ALD process; however, inventive concepts are not limited thereto. For example, the preliminary charge storage structure 350 may be formed at a different time than either or both of the channel 260 and the filling pattern 270.

Particularly, a preliminary charge storage structure layer and a channel layer may be sequentially formed on a sidewall of the channel hole 200, the exposed upper surface of the substrate 100 and an upper surface of the first insulating interlayer 190, a filling layer may be formed on the channel layer to fill a remaining portion of the channel hole 200, and the filling layer, the channel layer, and the preliminary charge storage structure layer may be planarized, e.g. planarized with a CMP and/or an etchback process, until the upper surface of the first insulating interlayer 190 may be exposed.

By the planarization process, the preliminary charge storage structure 250 and the channel 260 may be formed, each of which may have a cup-like shape and are sequentially stacked on the sidewall of the channel hole 200 and the upper surface of the substrate 100, and the filling pattern 270 may fill an inner space formed by the channel 260.

As the channel hole 200 in which the channel 260 is formed may define the channel hole array, the channel 260 in the channel hole 200 may also define a channel array.

In some example embodiments, the preliminary charge storage structure 250 may include a first blocking pattern 220, a preliminary charge trapping pattern 230, and a tunnel insulation pattern 240 that are sequentially stacked. For example, the first blocking pattern 220 and the tunnel insulation pattern 240 may include an oxide, e.g., silicon oxide. The preliminary charge trapping pattern 230 may include silicon, or silicon compound, e.g., at least one of silicon carbonitride, silicon boronitride, or silicon doped with nitrogen and/or carbon.

Upper portions of the filling pattern 270, the channel 260 and the preliminary charge storage structure 250 may be removed to form a second recess, a pad layer may be formed on the first insulating interlayer 190 to fill the recess, and the pad layer may be planarized with, e.g. a CMP and/or an etchback process, until the upper surface of the first insulating interlayer 190 may be exposed to form the pad 280.

Figure 5:
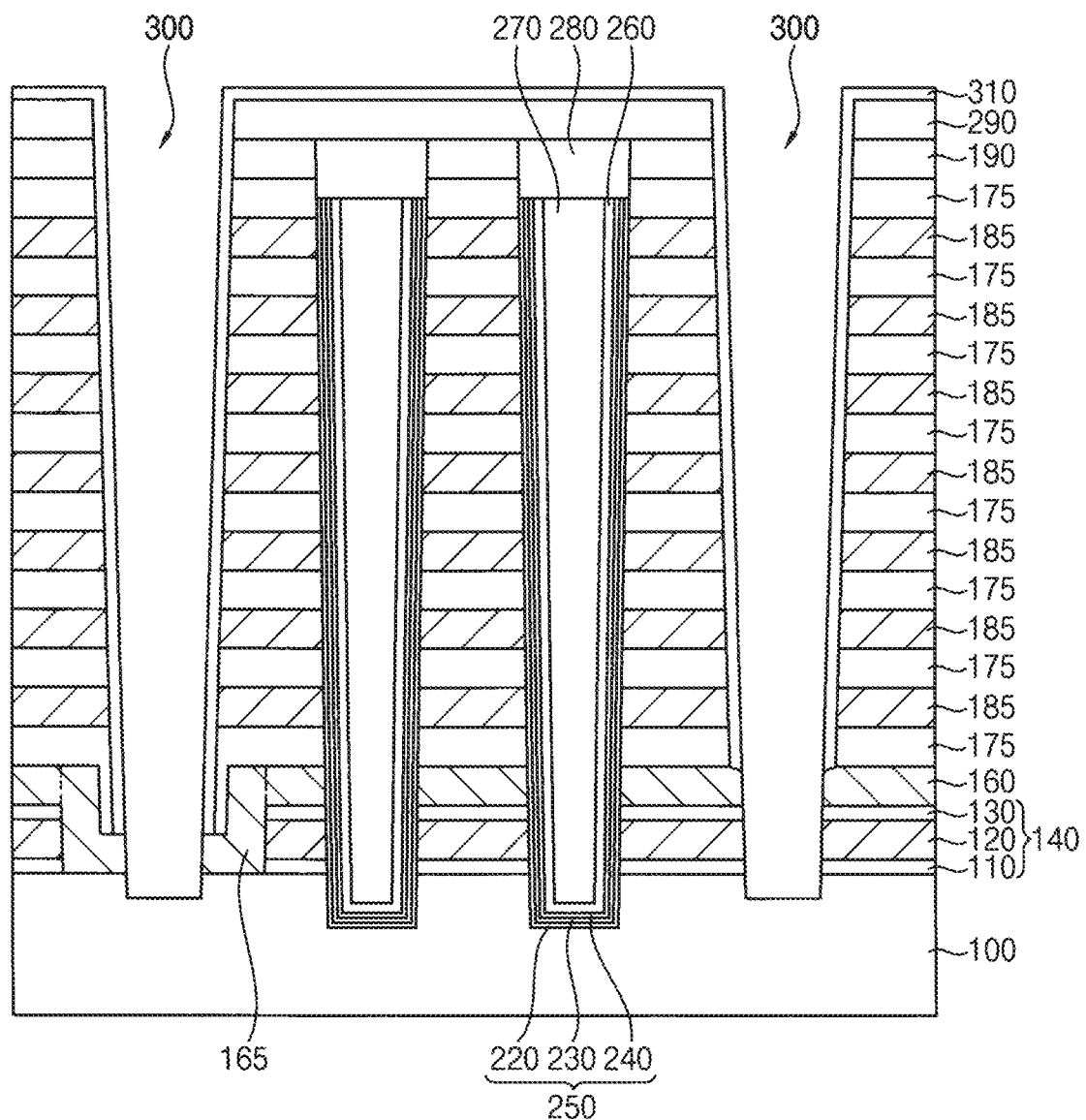

Referring to FIG. 5, a second insulating interlayer 290 may be formed on the first insulating interlayer 190 and the pad 280, and a second opening 300 may be formed through the first and second insulating interlayers 190 and 290 and the mold by a dry etching process such as a RIE process capable of etching a high aspect-ratio hole.

In some example embodiments, the dry etching process may be performed until an upper surface of the support layer 160 and/or an upper surface of the support pattern 165 is exposed, and an upper portion of the support layer 160 and/or an upper portion of the support pattern 165 may be also removed during the dry etching process. As the second opening 300 is formed, the insulation layers 170 and the fourth sacrificial layers 180 of the mold may be exposed.

In some example embodiments, the second opening 300 may extend in the second direction, and a plurality of second openings 300 may be formed in the third direction. As the second opening 300 is formed, the insulation layer 170 may be transformed into an insulation pattern 175 extending in the second direction, and the fourth sacrificial layer 180 may be transformed into a fourth sacrificial pattern 185 extending in the second direction.

A first spacer layer may be formed, e.g. formed with a PECVD process, on a sidewall of the second opening 300, the exposed upper surfaces of the second opening 300, an upper surface of the second insulating interlayer 290, and may be etched, e.g. anisotropically etched with, e.g., a dry etching process, to remove portions of the first spacer layer on the upper surfaces of the support layer 160 and the support pattern 165, so that a first spacer 310 is formed and that the upper surfaces of the support layer 160 and the support pattern 165 may be exposed again.

In some example embodiments, the first spacer 310 may include, e.g., undoped amorphous silicon and/or undoped polysilicon. When the first spacer 310 includes undoped amorphous silicon, the undoped amorphous silicon may be crystallized during subsequent deposition and/or thermal processes.

Portions of the support layer 160 and the support pattern 165 not covered by the first spacer 310 and a portion of the sacrificial layer structure 140 thereunder may be removed to enlarge the second opening in a downward direction. Thus, the second opening 300 may expose an upper surface of the substrate 100, and further extend through (e.g. into) an upper portion of the substrate 100.

When the sacrificial layer structure 140 is partially removed, the sidewall of the second opening 300 may be covered by the first spacer 310, and the first spacer 310 includes a material different from that of the sacrificial layer structure 140 so that the insulation patterns 175 and the fourth sacrificial patterns 185 included in the mold may not be removed.

Figure 6:
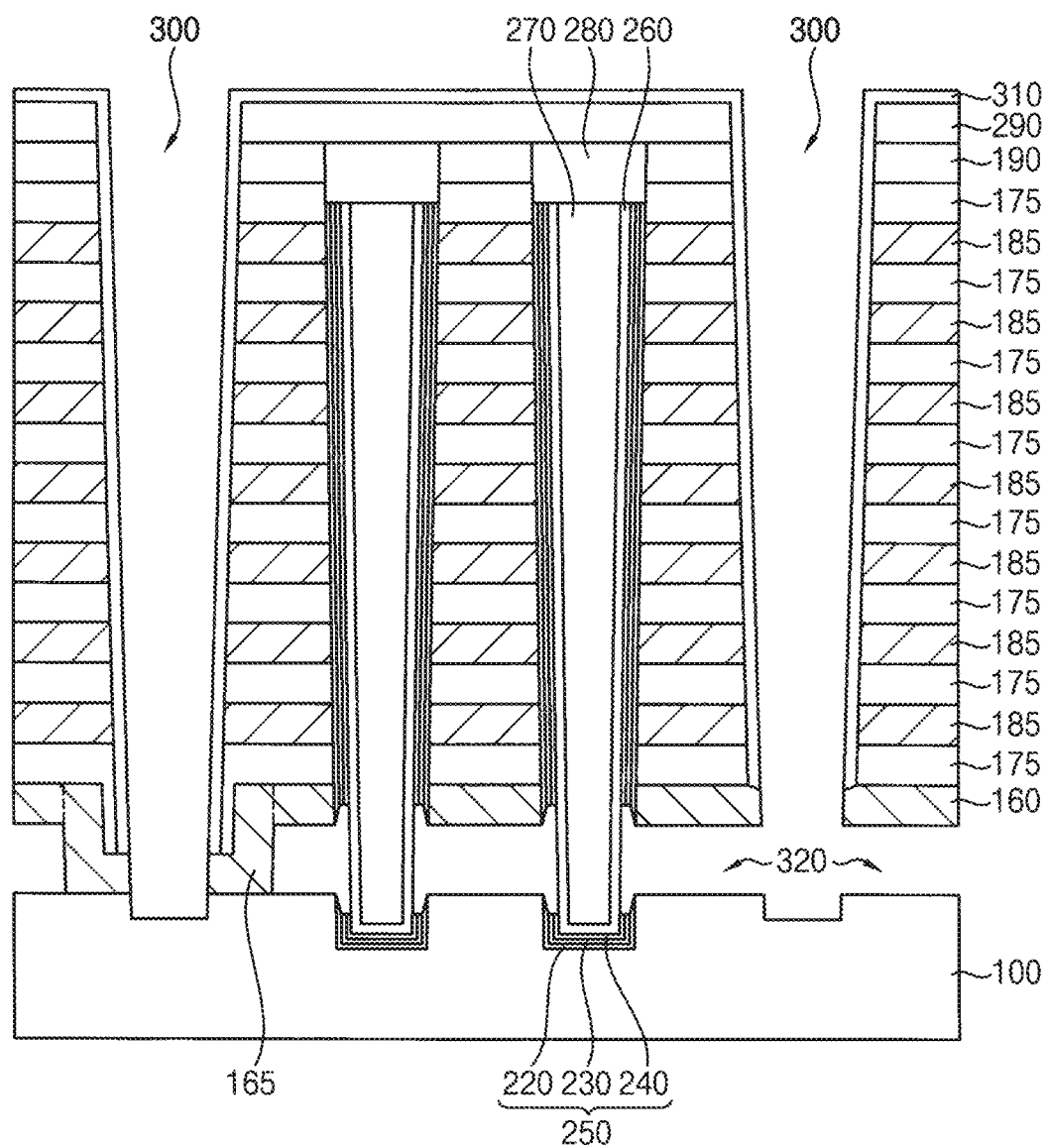

Referring to FIG. 6, the sacrificial layer structure 140 exposed by the second opening 300 may be removed to form a first gap 320 exposing a lower outer sidewall of the preliminary charge storage structure 250, and a portion of the preliminary charge storage structure 250 exposed by the first gap 320 may be further removed to expose a lower outer sidewall of the channel 260.

The sacrificial layer structure 140 and the preliminary charge storage structure 250 may be removed by a wet etching process using, e.g., (buffered) hydrofluoric acid, and/or by a dry etching process using, e.g., hydrogen fluoride. When the first gap 320 is formed, the support layer 160 and the support pattern 165 may not be removed so that the mold may not collapse.

As the first gap 320 is formed, the preliminary charge storage structure 250 may be divided into an upper portion extending through the mold to cover almost an entire outer sidewall of the channel 260, and a lower portion covering a bottom surface of the channel 260 on the substrate 100.

Hereinafter, the upper portion of the preliminary charge storage structure 250 covering almost the entire outer sidewall of the channel 260 may be referred to as the preliminary charge structure 250, and the lower portion of the preliminary charge storage structure 250 covering the bottom surface of the channel 260 on the substrate 100 may be referred to as a dummy charge storage structure. The tunnel insulation pattern 240, the preliminary charge trapping pattern 230, and the first blocking pattern 220 that are included in the dummy charge storage structure 250 may be referred to as a dummy tunnel insulation pattern, a dummy charge trapping pattern, and a dummy first blocking pattern, respectively.

Referring to FIG. 7, after removing the first spacer 310, a channel connection pattern 330 may be formed to fill the first gap 320.

The channel connection pattern 330 may be formed, e.g. formed with a PECVD process and/or with a low pressure chemical vapor deposition (LPCVD) process, by forming a channel connection layer on the substrate 100 and the second insulating interlayer 290 to fill the second opening 300 and the first gap 320, and performing an etch back process on the channel connection layer. The channel connection layer may include, e.g., amorphous silicon doped with n-type impurities such as phosphorus, and may be crystallized by heat generated during subsequent deposition/thermal processes so as to include polysilicon doped with n-type impurities. As the channel connection pattern 330 is formed, the channels 260 between neighboring ones of the second openings 300 in the third direction may be connected with each other to form a channel block.

An air gap 340 may be formed in the channel connection pattern 330; however, inventive concepts are not limited thereto.

Referring to FIG. 8, for example, impurities such as n-type impurities including at least one of phosphorus or arsenic, and/or p-type impurities including boron, may be implanted, e.g. with a beamline implantation process, into an upper portion of the substrate 100 exposed by the second opening 300 to form an impurity region 105.

The fourth sacrificial patterns 185 may be removed to form a second gap 350 exposing an outer sidewall of the preliminary charge storage structure 250. The fourth sacrificial patterns 185 may be removed by a wet etching process using e.g., phosphoric acid and/or (buffered) hydrofluoric acid and/or by a dry etching process.

Referring to FIG. 9, a first nitridation process may be performed on the preliminary charge storage structure 250 through the second gap 350.

In some example embodiments, the first nitridation process may include a decoupled plasma nitride (DPN) process and/or a rapid thermal nitridation (RTN) process using at least one of nitrogen (N), nitric oxide (NO), ammonia ($NH_3$), etc., and/or an annealing process. By the first nitridation process, the preliminary charge trapping pattern 230 of the preliminary charge storage structure 250 may be partially nitridated to form a charge trapping pattern 232.

The first nitridation process may be performed on the preliminary charge trapping pattern 230 through a portion of the first blocking pattern 220 exposed by the second gap 350. Thus, nitrogen may be implanted into a portion of the preliminary charge trapping pattern 230 overlapping the second gap 350 in a horizontal direction substantially parallel to the upper surface of the substrate 100 and a portion of the preliminary charge trapping pattern 230 adjacent thereto in the first direction so that the portions of the preliminary charge trapping pattern 230 including silicon (e.g. silicon without nitrogen) may be transformed into the charge trapping pattern 232 including silicon nitride (SiN).

In some example embodiments, a plurality of charge trapping patterns 232 may be formed to be spaced apart from each other in the first direction, and a first length L1 in the first direction of an inner sidewall of each of the charge trapping patterns 232 contacting the tunnel insulation pattern 240 may be less than a second length L2 in the first direction of an outer sidewall of each of the charge trapping patterns 232 contacting the first blocking pattern 220. However, the first length L1 of each of the charge trapping patterns 232 may be greater than a third length L3 in the first direction of a corresponding one of the second gaps 350.

In some example embodiments, a length in the first direction of each of the charge trapping patterns 232 may gradually increase from the tunnel insulation pattern 240 to the first blocking pattern 220, and an absolute value of a slope of an upper surface or a lower surface of each of the charge trapping patterns 232 with respect to the upper surface of the substrate 100 may decrease from the tunnel insulation pattern 240 to the first blocking pattern 220. In some example embodiments, the charge trapping patterns 232 may be concave, e.g. concave in the third direction from the tunnel insulation pattern 240 to the first blocking pattern 220.

Referring to FIG. 10, a first oxidation process may be performed on the preliminary charge storage structure 250 through the second gap 350.

In some example embodiments, the first oxidation process may include at least one of a rapid thermal oxidation (RTO) process, an annealing process, a dry oxidation process, a wet oxidation process, etc. The first oxidation process may be or include a selective oxidation process in which the charge trapping pattern 232 including silicon nitride may not be oxidized or may only partially oxidized, for example may not be oxidized because of the inclusion of nitride. For example, the charge trapping pattern 232 may serve as a oxidation prevention pattern (or an oxidation reduction pattern) during the first oxidation process. By the first oxidation process, a remaining portion of the preliminary charge trapping pattern 230 in the preliminary charge storage structure 250 may be oxidized, and may form a division pattern 234.

However, a lower portion of the preliminary charge trapping pattern 230 may not be affected by the first nitridation process or the first oxidation process, so as not to be converted into the charge trapping pattern 232 or the division pattern 234 but to remain, e.g. to remain as the preliminary charge trapping pattern 230.

By the first oxidation process, a portion of the preliminary charge trapping pattern 230 between neighboring ones of the charge trapping patterns 232 in the first direction may be oxidized to form the division pattern 234 including silicon oxide ($SiO_2$). In some example embodiments, an absolute value of a slope of an upper surface or a lower surface of the division pattern 234 with respect to the upper surface of the substrate 100 may gradually decrease from the tunnel insulation pattern 240 to the first blocking pattern 220.

Hereinafter, the tunnel insulation pattern 240, the charge trapping patterns 232, the division patterns 234, and the first blocking pattern 220 may be referred to as a first charge storage structure 252. For example, the first charge storage structure 252 may be formed on an outer sidewall of the channel 260 on the channel connection pattern 330, and the dummy charge storage structure 250 may be formed on an outer sidewall and a bottom surface of the channel 260 under the channel connection pattern 330.

Figure 11:
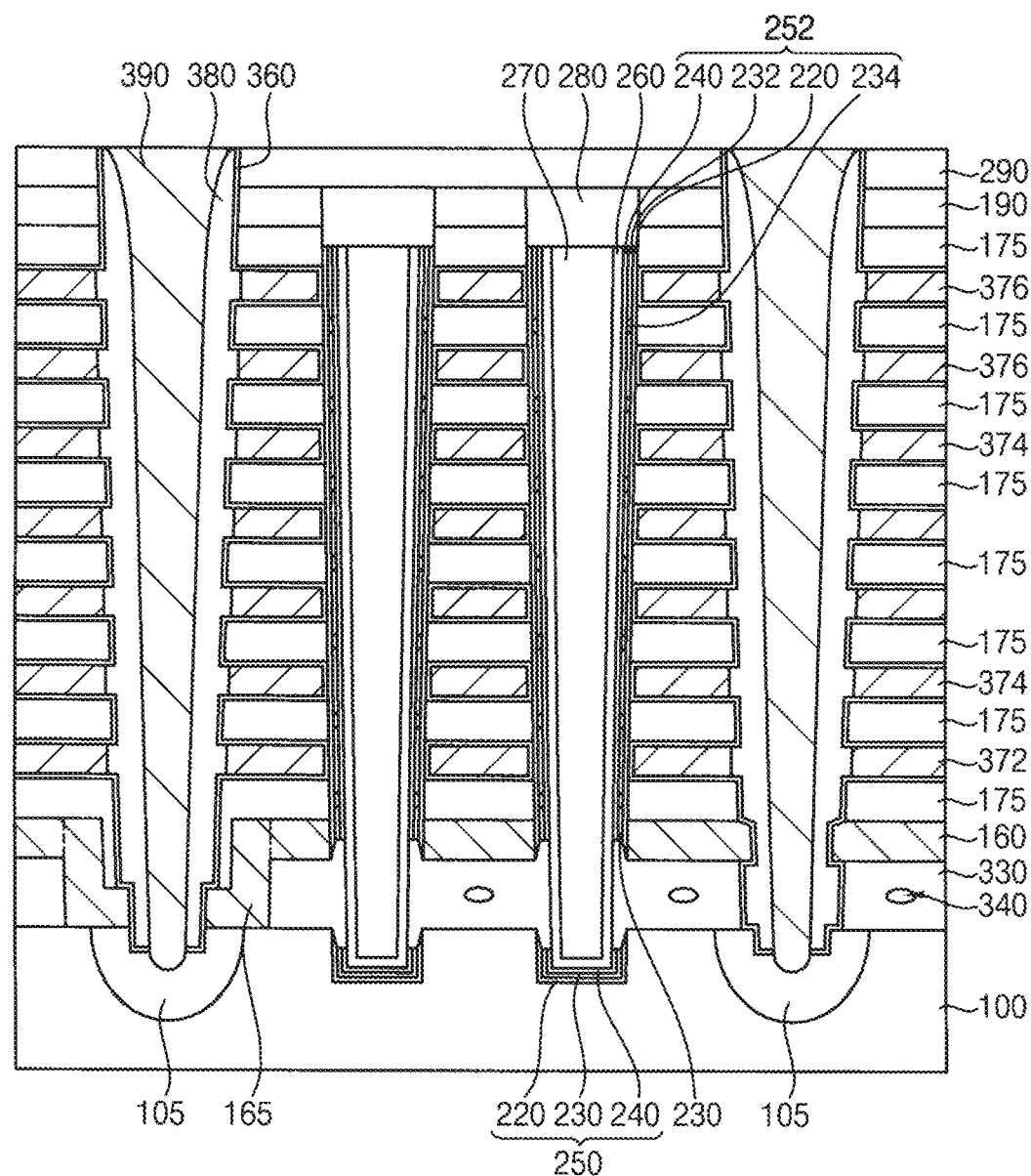

Referring to FIG. 11, a second blocking layer may be formed on the exposed outer sidewall of the first charge storage structure 252, inner walls of the second gaps 350, surfaces of the insulation patterns 175, sidewalls of the support layer 160 and the support pattern 165, a sidewall of the channel connection pattern 330, the upper surface of the substrate 100, and an upper surface of the second insulating interlayer 290, and a gate electrode layer may be formed on the second blocking layer. The gate electrode layer may include a gate barrier layer and a gate conductive layer that are sequentially stacked.

The gate electrode layer may be partially removed to form a gate electrode in each of the second gaps 350. In some example embodiments, the gate electrode layer may be partially removed by a wet etching process.

In some example embodiments, the gate electrode may extend in the second direction, and a plurality of gate electrodes may be formed in the first direction. Additionally or alternatively, a plurality of gate electrodes may be formed in the third direction. For example, the gate electrodes each of which may extend in the second direction may be spaced apart from each other by the second opening 300.

The gate electrode may include first, second, and third gate electrodes 372, 374, and 376.

A second spacer layer may be formed on the second blocking layer (e.g. within the second opening 300), and anisotropically etched to form a second spacer 380 on the sidewall of the second opening 300. Thus an upper surface of the second blocking layer on the substrate 100 may be partially exposed.

A portion of the second blocking layer not covered by the second spacer 380 may be etched to form a second blocking pattern 360, and a portion of the second blocking layer on the upper surface of the second insulating interlayer 290 may be also removed. Additionally, an upper portion of the impurity region 105 may be partially removed.

A conductive layer may be formed, e.g. formed with a PECVD process or with a PECVD process and a sputter process, on the upper surface of the impurity region 105, the second spacer 380, and the second insulating interlayer 290 to fill a remaining portion of the second opening 300. The conductive layer may be planarized, e.g. may be planarized with a CMP process and/or with an etchback process until the upper surface of the second insulating interlayer 290 may be exposed to form a CSP 390. The CSP 390 may include a metal, such as tungsten, and/or may include a (doped) polysilicon layer; however, inventive concepts are not limited thereto.

Referring to FIGS. 1 and 2 again, after forming a third insulating interlayer 400 on the second insulating interlayer 290, the CSP 390, the second spacer 380, and the second blocking pattern 360, a contact plug 410 may be formed through the second and third insulating interlayers 290 and 400 to contact an upper surface of the pad 280.

A bit line 430 may be formed to contact an upper surface of the contact plug 410 so that the vertical memory device may be manufactured.

As illustrated above, the first nitridation process may be performed on the preliminary charge storage structure 250 including the preliminary charge trapping pattern 230 to form a plurality of charge trapping patterns 232 spaced apart from each other, and the first oxidation process may be performed to form the division pattern 234 between the charge trapping patterns 232. For example, instead of a physical process such as a cutting process and/or a patterning process on the preliminary charge trapping pattern 230 extending in the first direction, a chemical process such as the nitridation process and/or the oxidation process may be performed so that the charge trapping patterns 232 facing the gate electrodes 372, 374 and 376 may be formed to be spaced apart from each other in the first direction.

Figure 12:
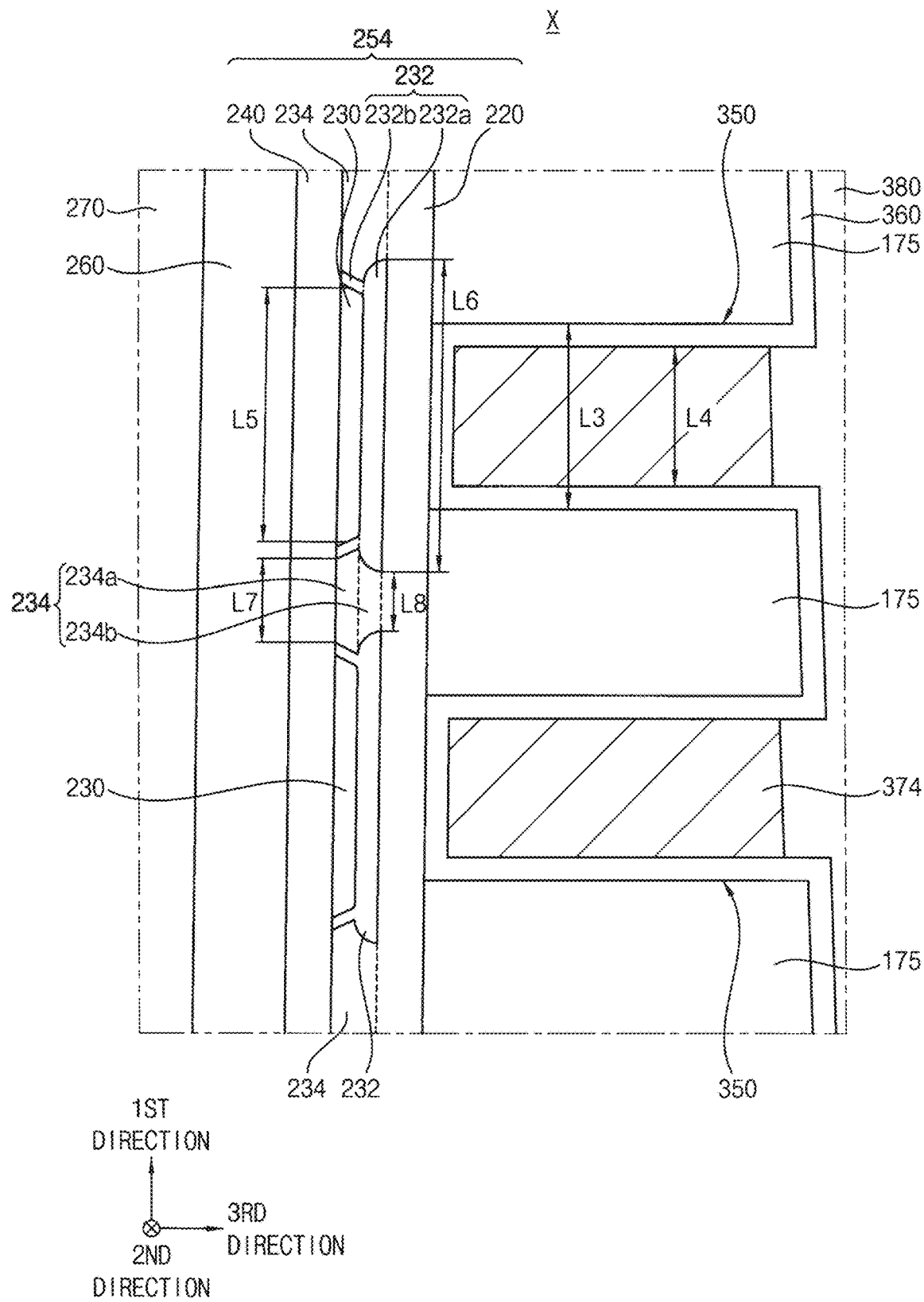
FIG. 12 is a cross-sectional view illustrating a vertical memory device in accordance with some example embodiments, and an enlarged cross-sectional view of the region X of FIG. 1.

FIG. 12 is a cross-sectional view illustrating a vertical memory device in accordance with some example embodiments, and an enlarged cross-sectional view of the region X of FIG. 1. This vertical memory device may be substantially the same as or similar to that of FIGS. 1 and 2, except for the charge storage structure. Thus, like reference numerals refer to like elements, and repetitive descriptions thereon are omitted herein.

Referring to FIG. 12, the vertical memory device may include a second charge storage structure 254 instead of, or in addition to, the first charge storage structure 252, and the second charge storage structure 254 may include the tunnel insulation pattern 240, the preliminary charge trapping pattern 230, the charge trapping pattern 232, and the first blocking pattern 220 that are sequentially stacked in the horizontal direction from the outer sidewall of the channel 260. The second charge storage structure 254 may further include the division pattern 234.

The preliminary charge trapping pattern 230 may be the remaining portion of the preliminary charge trapping pattern 230 that has not been converted into the charge trapping pattern 232 by the first nitridation process, which may be referred to as a first charge trapping pattern hereinafter, and the charge trapping pattern 232 may be referred to as a second charge trapping pattern.

For example, the second charge storage structure 254 may include the first and second charge trapping patterns 230 and 232 facing a corresponding one of the gate electrodes 372, 374, and 376 spaced apart from each other in the first direction between the tunnel insulation pattern 240 and the first blocking pattern 220, each of which may extend in the first direction. The first charge trapping pattern 230 may include silicon or silicon compounds, e.g., at least one of silicon carbonitride, silicon boronitride, or silicon doped with at least one of nitrogen or carbon. The second charge trapping pattern 232 may include, e.g., silicon nitride.

In some example embodiments, a fifth length L5 in the first direction of the first charge trapping pattern 230 may gradually decrease from the tunnel insulation pattern 240 to the second charge trapping pattern 232.

In some example embodiments, the second charge trapping pattern 232 may include a first portion 232a covering an outer sidewall of the first charge trapping pattern 230 and contacting the first blocking pattern 220, and a second portion 232b extending from the first portion 232a toward the tunnel insulation pattern 240 to cover upper and lower surfaces of the first charge trapping pattern 230. A length in the first direction of the first portion 232a of the second charge trapping pattern 232 may gradually increase as it approaches the first blocking pattern 220, and the second portion 232b of the second charge trapping pattern 232 may be slanted with respect to the upper surface of the substrate 100.

In some example embodiments, a length, e.g. a maximum length in the first direction of the second charge trapping pattern 232, that is, a sixth length L6 of the first portion 232a of the second charge trapping pattern 232 contacting the first blocking pattern 220 may be greater than the fourth length L4 in the first direction of the corresponding ones of the gate electrodes 372, 374 and 376 or the third length L3 in the first direction of the second gap 350 in which each of the gate electrodes 372, 374 and 376 may be formed.

The division pattern 234 may be formed between neighboring ones of the first and second charge trapping patterns 230 and 232 in the first direction, and thus the first and second charge trapping patterns 230 and 232 may be spaced apart from each other in the first direction. The division pattern 234 may face the insulation pattern 175 in the horizontal direction, particularly, a central portion in the first direction of the insulation pattern 175.

In some example embodiments, the division pattern 234 may include a first portion 234a of which a length in the first direction may gradually increase from the tunnel insulation pattern 240 toward the first blocking pattern 220, and a second portion 234b of which a length in the first direction may gradually decrease from the first portion 234a toward the first blocking pattern 220. A length, e.g. a minimum length in the first direction of the first portion 234a of the division pattern 234, that is, a seventh length L7 in the first direction of an inner sidewall of the first portion 234a of the division pattern 234 contacting the tunnel insulation pattern 240 may be greater than a length, e.g. a minimum length in the first direction of the second portion 234b of the division pattern 234, that is, an eighth length L8 in the first direction of the second portion 234b of the division pattern 234 contacting the first blocking pattern 220.

In some example embodiments, the division pattern 234 may include a material substantially the same as that of the first blocking pattern 220, e.g., silicon oxide, and thus may be merged therewith, e.g. may be merged therewith in subsequent thermal processing steps.

FIGS. 13 to 16 are cross-sectional views, particularly, enlarged cross-sectional views of the region X of FIG. 1 illustrating a method of manufacturing a vertical memory device in accordance with some example embodiments. This method may include processes substantially the same as or similar to those of FIGS. 3 to 11 and FIGS. 1 and 2, and thus repetitive descriptions thereon are omitted herein.

Figure 13:
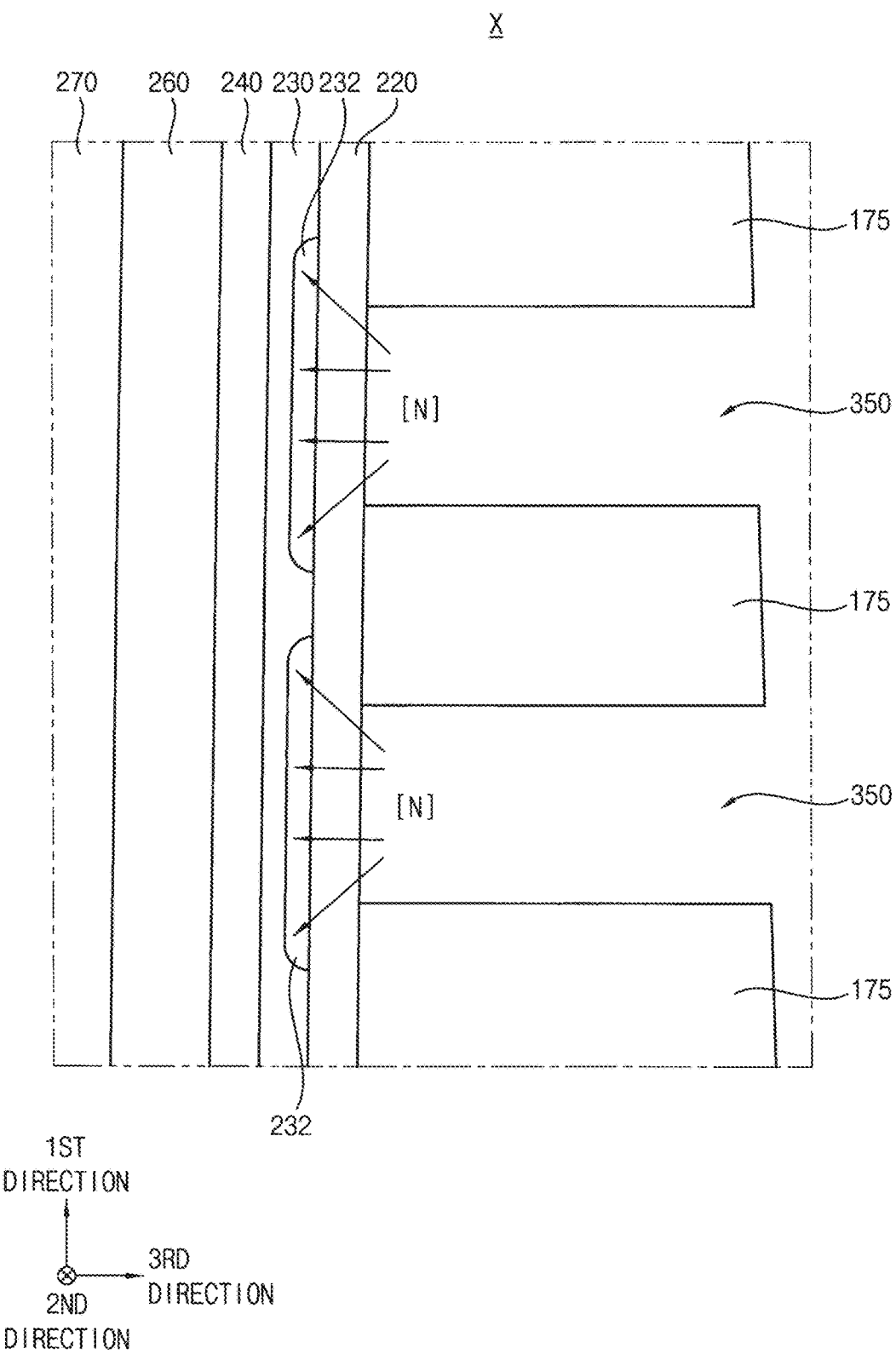
FIGS. 13 to 16 are cross-sectional views, particularly, enlarged cross-sectional views of the region X of FIG. 1 illustrating a method of manufacturing a vertical memory device in accordance with some example embodiments.

Referring to FIG. 13, processes substantially the same as or similar to those illustrated with reference to FIGS. 3 to 9 may be performed.

However, in addition to or alternative to the process illustrated with reference to FIGS. 3 to 9, the first nitridation process may be performed on the preliminary charge storage structure 250 through the second gap 350, so that only a portion of the preliminary charge trapping pattern 230 adjacent the first blocking pattern 220 may be nitridated to form the charge trapping pattern 232.

Figure 14:
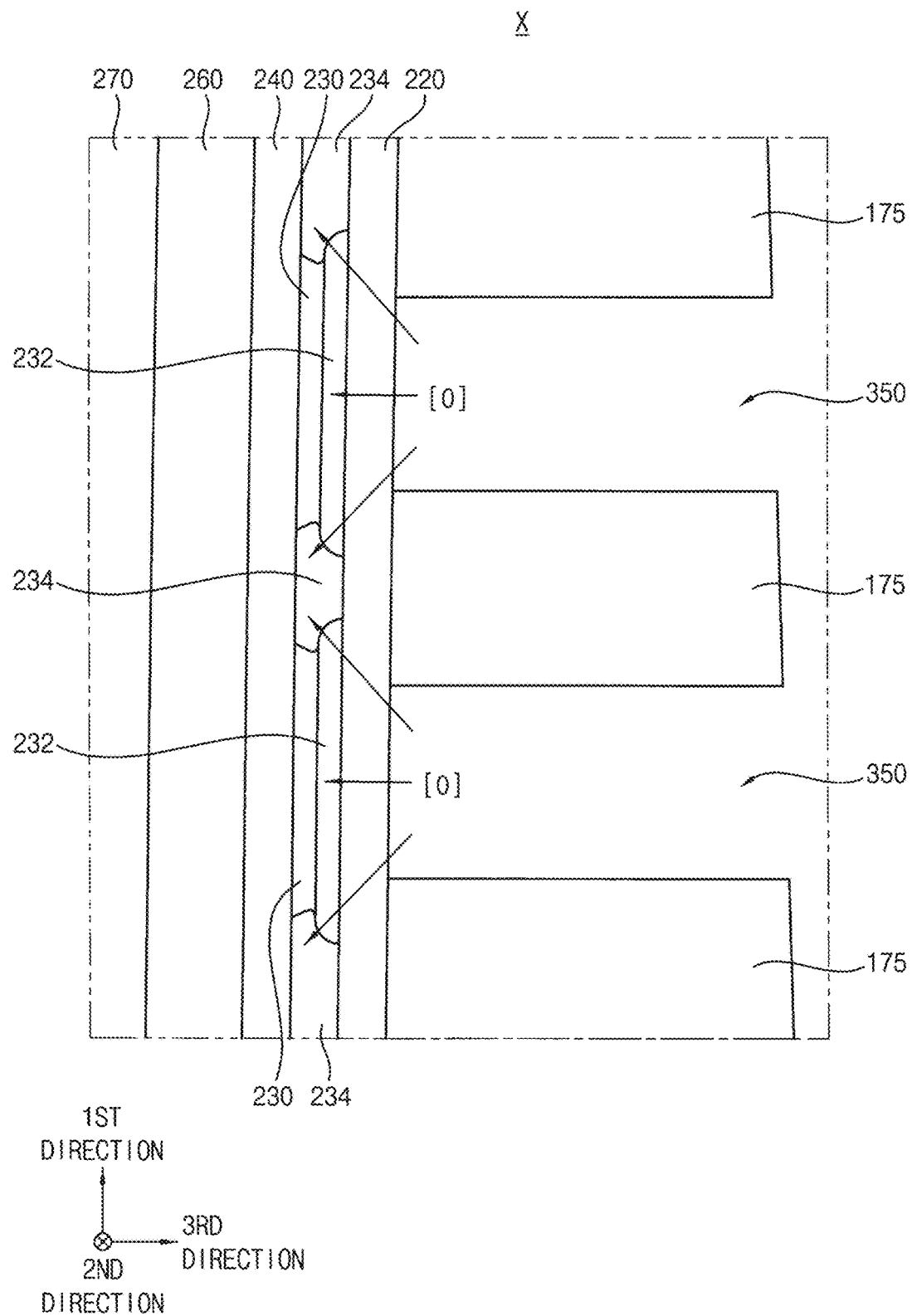

Referring to FIG. 14, processes substantially the same as or similar to those illustrated with reference to FIG. 10 may be performed.

For example, the first oxidation process may be performed on the preliminary charge storage structure 250 through the second gap 350, and thus a portion of the preliminary charge trapping pattern 230 facing the insulation pattern 175 in the horizontal direction may be oxidized to form the division pattern 234.

The charge trapping pattern 232 contacting the first blocking pattern 220 and the preliminary charge trapping pattern 230 contacting the tunnel insulation pattern 240 may be formed between neighboring ones of the division patterns 234 in the first direction.

Figure 15:
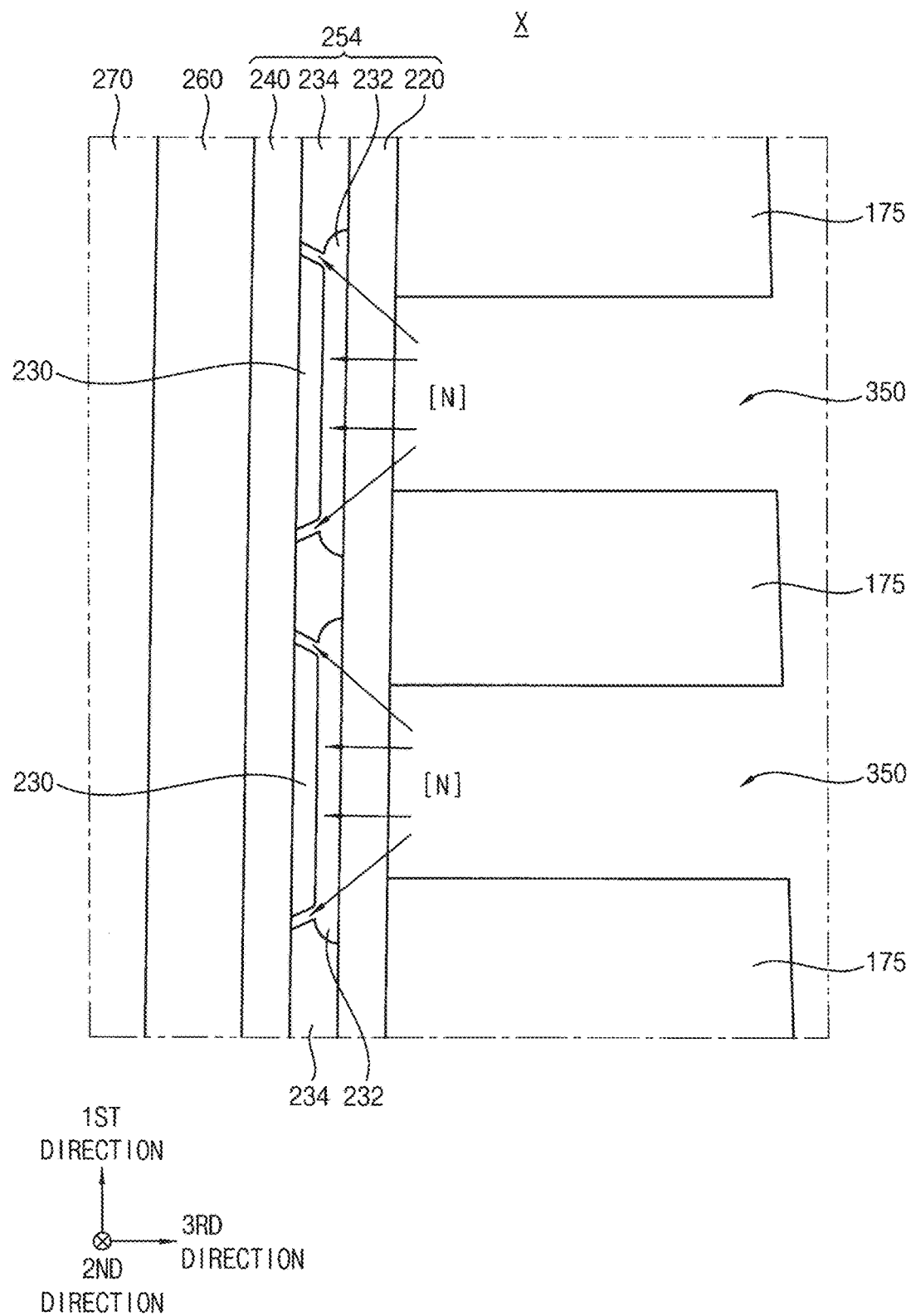

Referring to FIG. 15, a second nitridation process may be performed on the preliminary charge storage structure 250 through the second gap 350 to form a second charge storage structure 254.

The second nitridation process may be substantially the same as the first nitridation process, and thus the preliminary charge trapping pattern 230 may be partially nitridated to further form the charge trapping pattern 232.

In some example embodiments, lower and upper ends of the preliminary charge trapping pattern 230 may be nitridated by the second nitridation process, and the nitridated portion may be merged to the charge trapping pattern 232 having been already formed.

Figure 16:
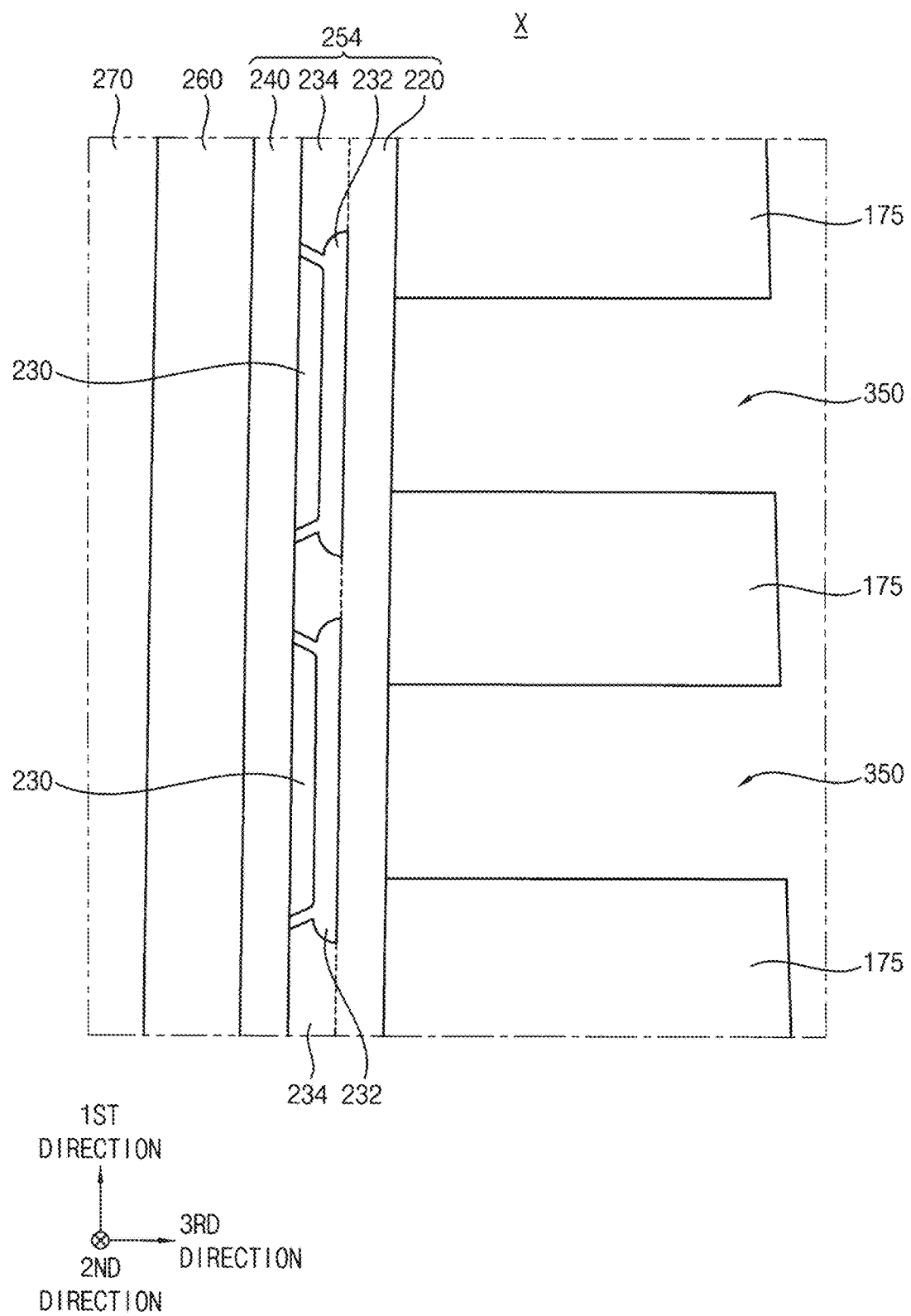

Referring to FIG. 16, a curing process may be performed on the second charge storage structure 254 through the second gap 350.

The curing process may be performed on the first blocking pattern 220 including, e.g., silicon oxide, and may cure the damaged first blocking pattern 220 by the previous first and second nitridation processes. In some example embodiments, the curing process may include a wet etching process.

The wet etching process may affect the division pattern 234, and thus the division pattern 234 and the first blocking pattern 220 may include substantially the same material to be merged therewith.

Processes substantially the same as or similar to those illustrated with reference to FIG. 11 and FIGS. 1 and 2 may be performed to complete the fabrication of the vertical memory device.

Figure 17:
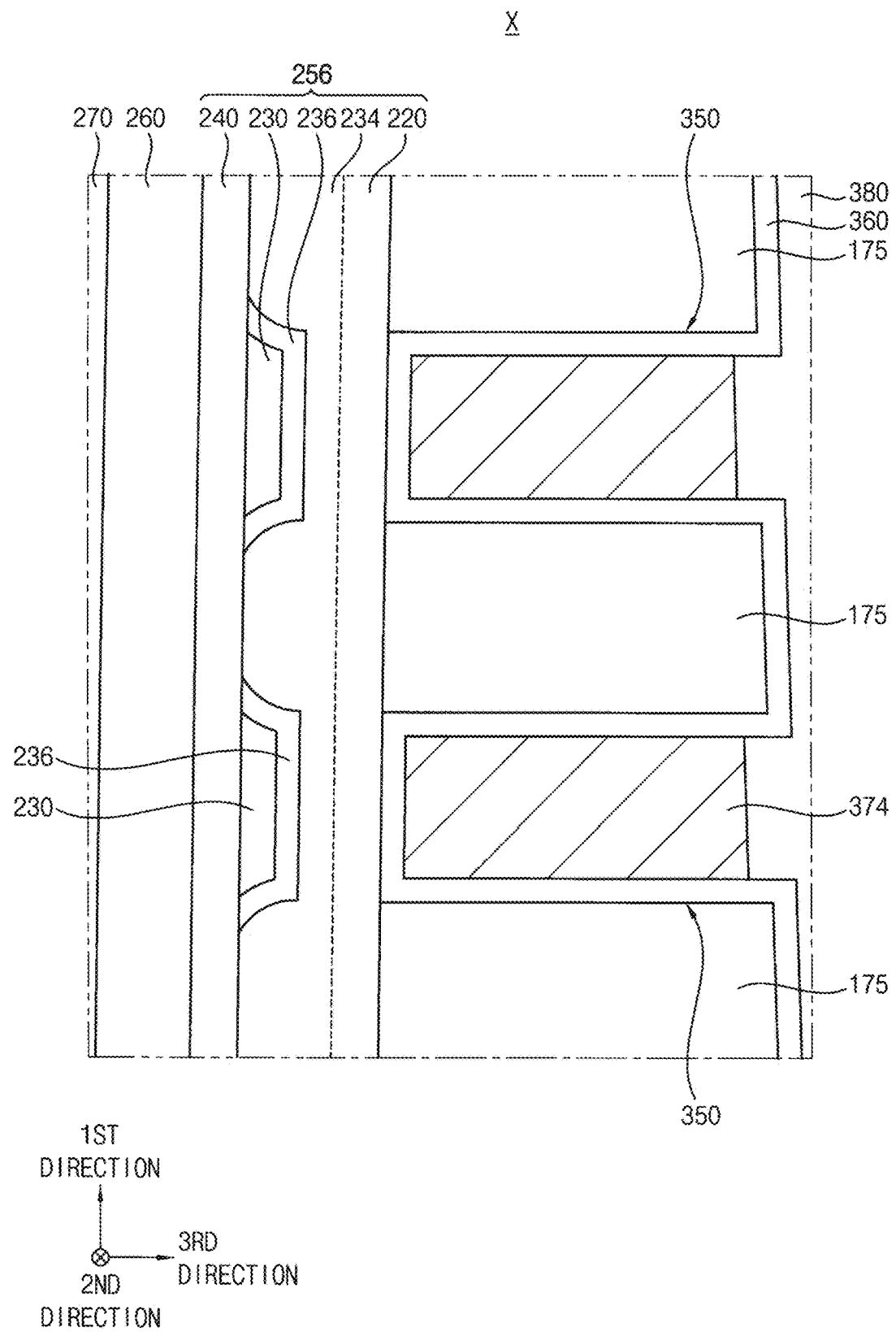
FIG. 17 is a cross-sectional view illustrating a vertical memory device in accordance with some example embodiments, and an enlarged cross-sectional view of the region X of FIG. 1.

FIG. 17 is a cross-sectional view illustrating a vertical memory device in accordance with some example embodiments, and an enlarged cross-sectional view of the region X of FIG. 1.

Referring to FIG. 17, the vertical memory device may include a third charge storage structure 256 instead of, or in addition to, the first charge storage structure 252, and the third charge storage structure 256 may include the tunnel insulation pattern 240, the first charge trapping pattern 230, a third charge trapping pattern 236, and the first blocking pattern 220 that are sequentially stacked in the horizontal direction from the outer sidewall of the channel 260. The third charge storage structure 256 may further include the division pattern 234.

The third charge storage structure 256 may include the first and third charge trapping patterns 230 and 236 facing a corresponding one of the gate electrodes 372, 374, and 376 spaced apart from each other in the first direction between the tunnel insulation pattern 240 and the first blocking pattern 220, each of which may extend in the first direction. The third charge trapping pattern 236 may include, e.g., silicon nitride.

In some example embodiments, the third charge trapping pattern 236 may cover an outer sidewall and lower and upper surfaces of the first charge trapping pattern 230. The division pattern 234 may extend in the first direction to cover an outer sidewall and lower and upper surfaces of the third charge trapping pattern 236. Thus, the first and third charge trapping patterns 230 and 236 may be spaced apart from each other in the first direction by the division pattern 234.

In some example embodiments, a thickness of the division pattern 234 may be greater than that of the tunnel insulation pattern 240 or the first blocking pattern 220. The division pattern 234 may include a material substantially the same as that of the first blocking pattern 220, and thus may be merged therewith.

FIGS. 18 to 22 are cross-sectional views, particularly, enlarged cross-sectional views of the region X of FIG. 1 illustrating a method of manufacturing a vertical memory device in accordance with some example embodiments.

Figure 18:
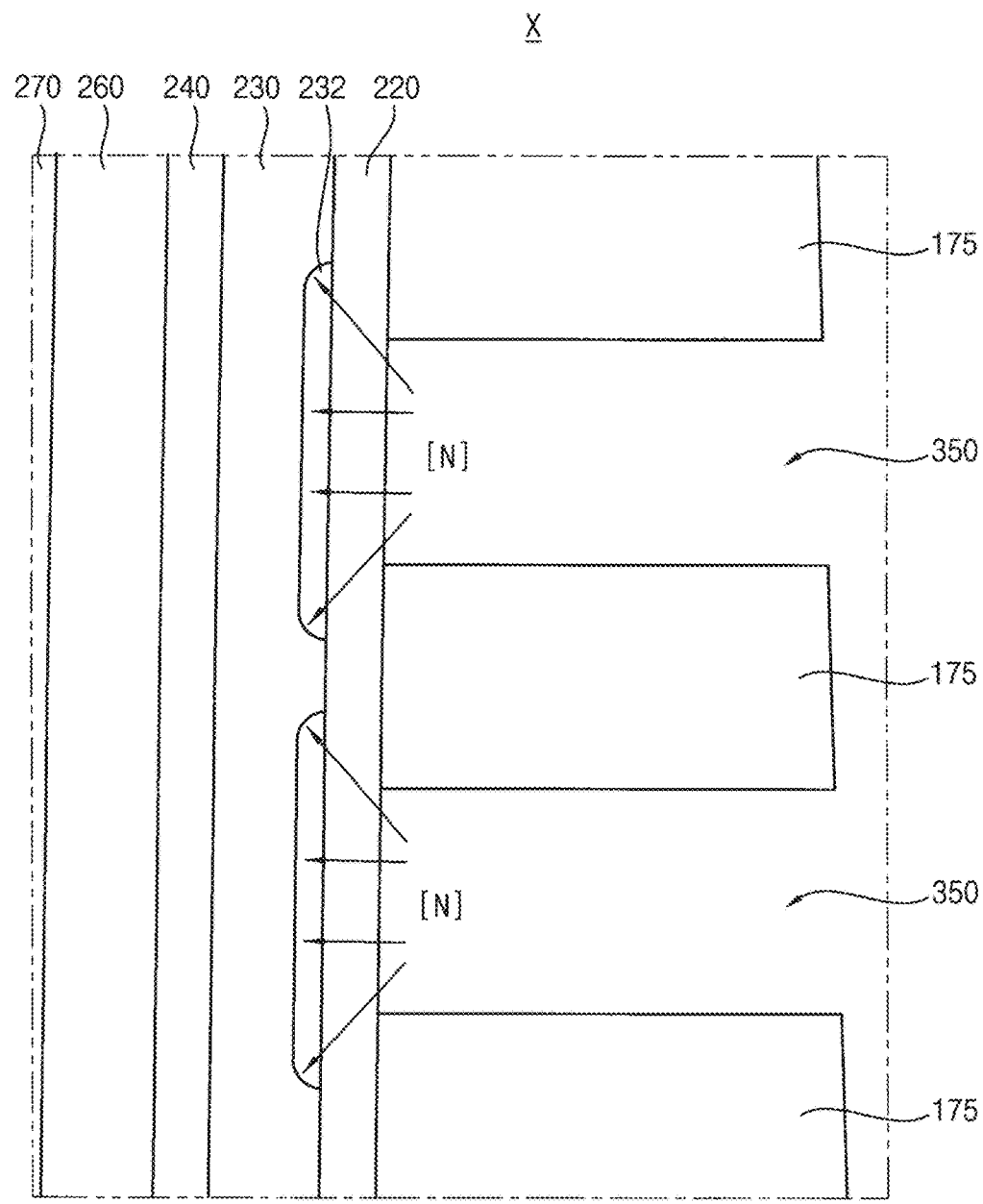
FIGS. 18 to 22 are cross-sectional views, particularly, enlarged cross-sectional views of the region X of FIG. 1 illustrating a method of manufacturing a vertical memory device in accordance with some example embodiments.

Referring to FIG. 18, processes substantially the same as or similar to those illustrated with reference to FIGS. 3 to 9 may be performed.

However, a thickness of the preliminary charge trapping pattern 230 may be greater than that of the tunnel insulation pattern 240 or the first blocking pattern 220, and when the first nitridation process is performed on the preliminary charge storage structure 250 through the second gap 350, only a portion of the preliminary charge trapping pattern 230 adjacent the first blocking pattern 220 may be nitridated to form the charge trapping pattern 232.

Figure 19:
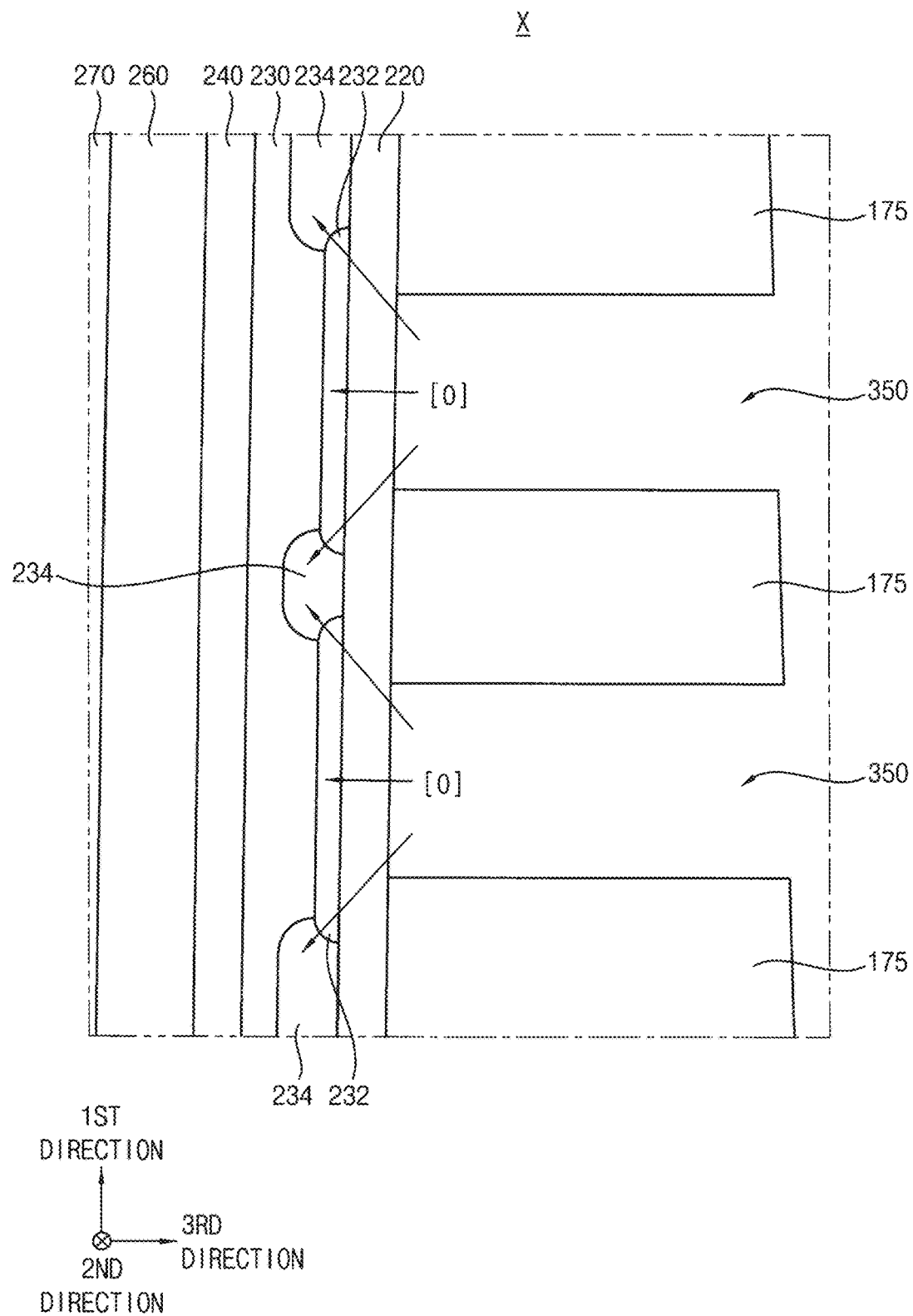

Referring to FIG. 19, processes substantially the same as or similar to those illustrated with reference to FIG. 10 may be performed.

For example, the first oxidation process may be performed on the preliminary charge storage structure 250 through the second gap 350, and thus a portion of the preliminary charge trapping pattern 230 facing the insulation pattern 175 in the horizontal direction may be oxidized to form the division pattern 234. However, as the preliminary charge trapping pattern 230 has the relatively large thickness, only a portion of the preliminary charge trapping pattern 230 adjacent the insulation pattern 175 may be oxidized to form the division pattern 234, and the preliminary charge trapping pattern 230 may not be divided into a plurality of pieces in the first direction by the first oxidation process.

Figure 20:
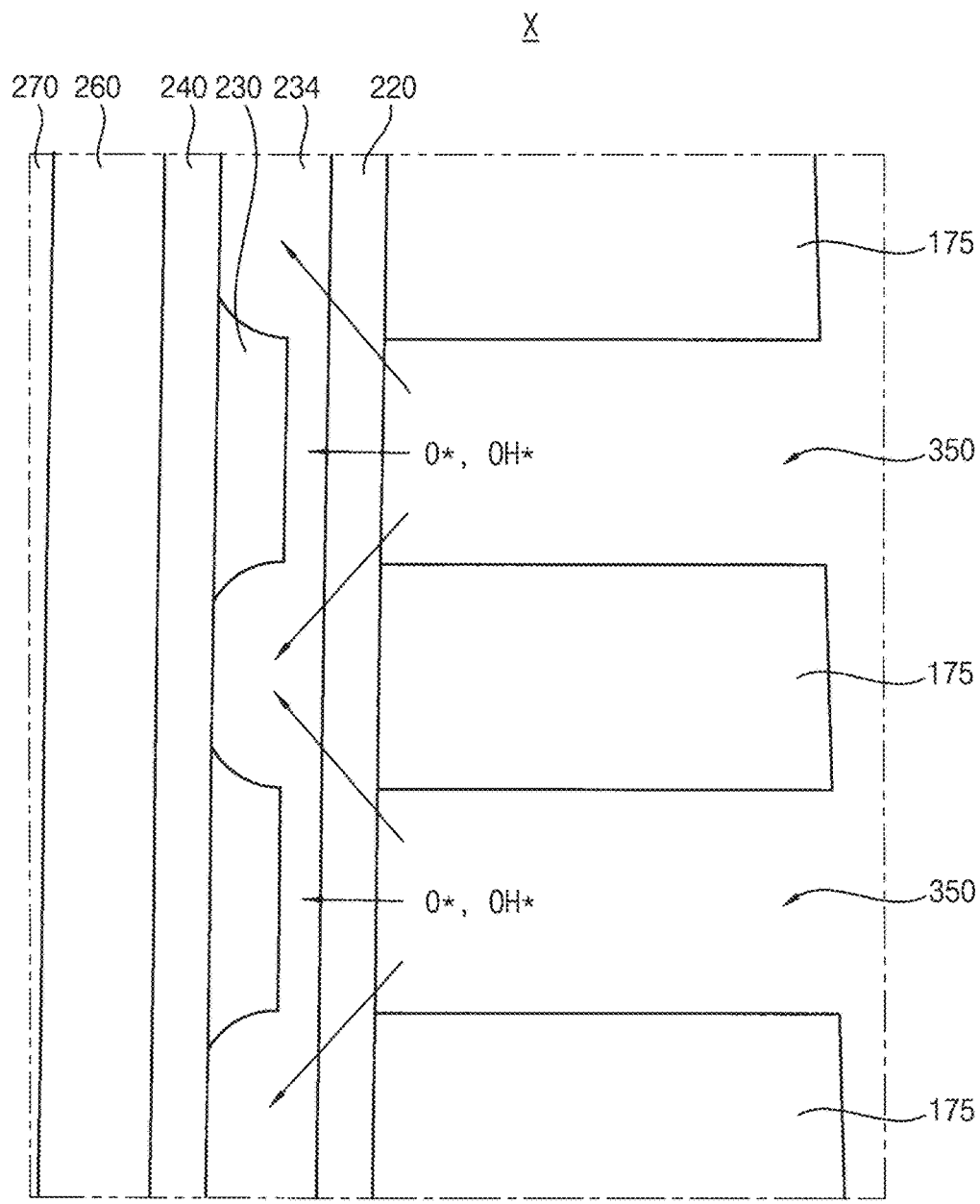

Referring to FIG. 20, a second oxidation process may be performed on the preliminary charge storage structure 250 through the second gap 350.

In some example embodiments, the second oxidation process may include a radical oxidation process using at least one of oxygen radical (O*), hydroxyl radical (OH*), etc., and not only the preliminary charge trapping pattern 230 but also the charge trapping pattern 232 including silicon nitride may be oxidized, unlike the first oxidation process.

Thus, the division pattern 234 may be enlarged by the second oxidation process to cover an outer sidewall and lower and upper surfaces of the preliminary charge trapping pattern 230 that may extend in the first direction and has not been converted into the charge trapping pattern 232. The division pattern 234 before being enlarged may be referred to as a preliminary division pattern in comparison with the division pattern 234 after being enlarged. The preliminary charge trapping pattern 230 may be divided into a plurality of pieces spaced apart from each other in the first direction by the second oxidation process.

Figure 21:
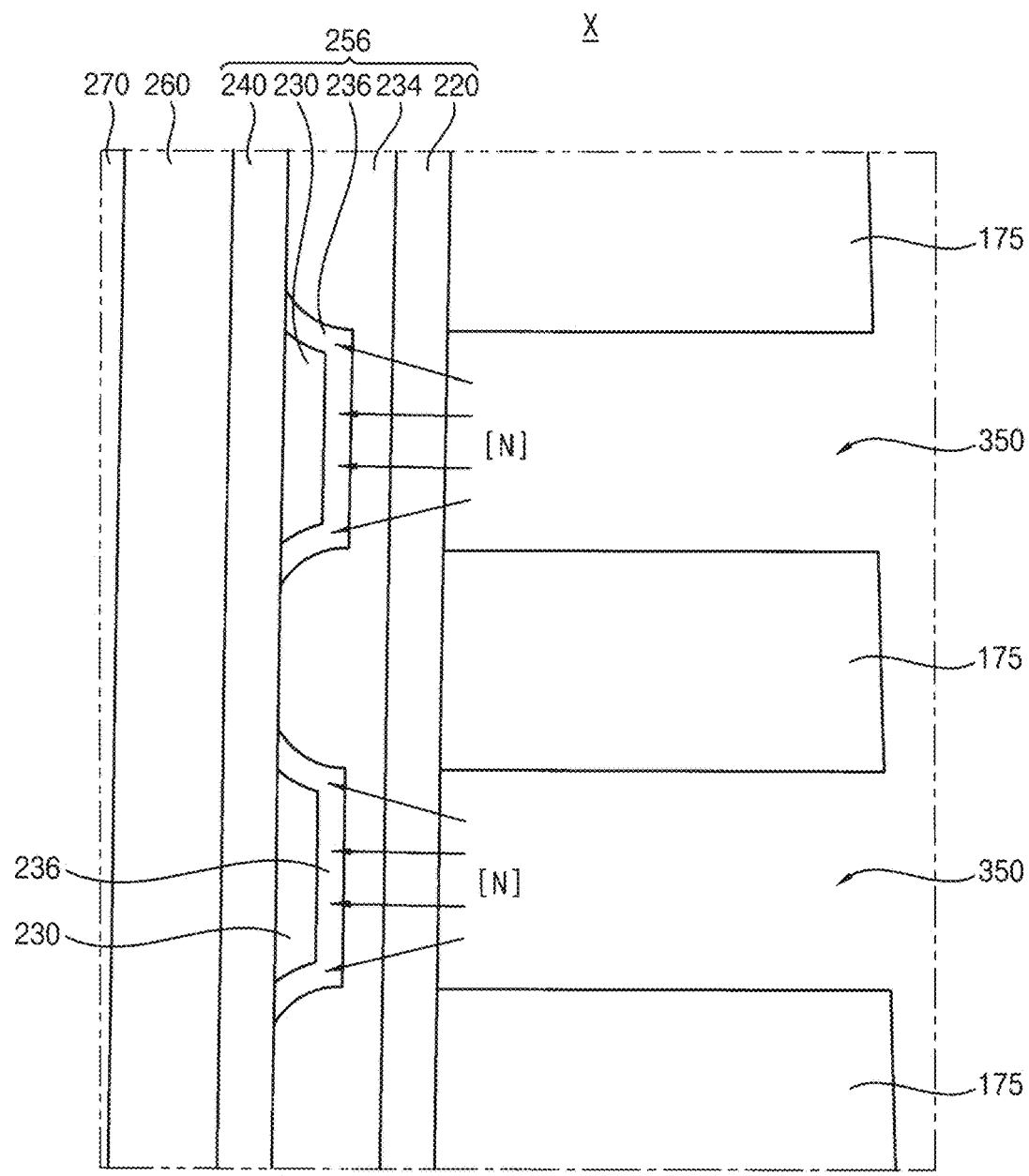

Referring to FIG. 21, the second nitridation process may be performed on the preliminary charge storage structure 250 through the second gap 350 to form a third charge storage structure 256.

As the second nitridation process is performed, the outer sidewall and the lower and upper surfaces of the preliminary charge trapping pattern 230 may be nitridated to form a third charge trapping pattern 236 including silicon nitride.

Figure 22:
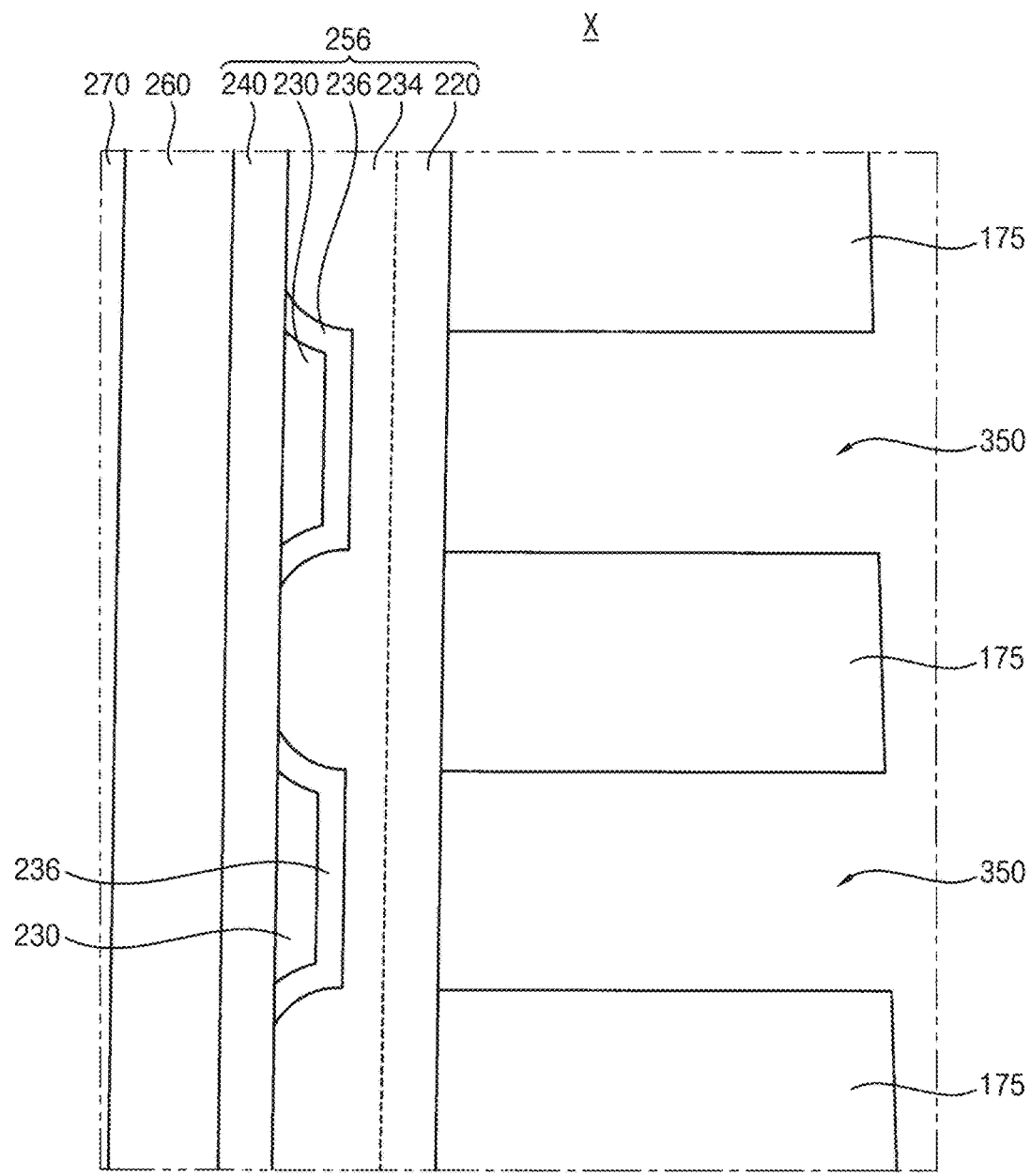

Referring to FIG. 22, the curing process may be performed on the third charge storage structure 256 through the second gap 350, and thus the damaged first blocking pattern 220 by the previous first and second nitridation processes may be cured.

The curing process may affect the division pattern 234, and thus the division pattern 234 and the first blocking pattern 220 may include substantially the same material to be merged therewith.

Processes substantially the same as or similar to those illustrated with reference to FIG. 11 and FIGS. 1 and 2 may be performed to complete the fabrication of the vertical memory device.

Figure 23:
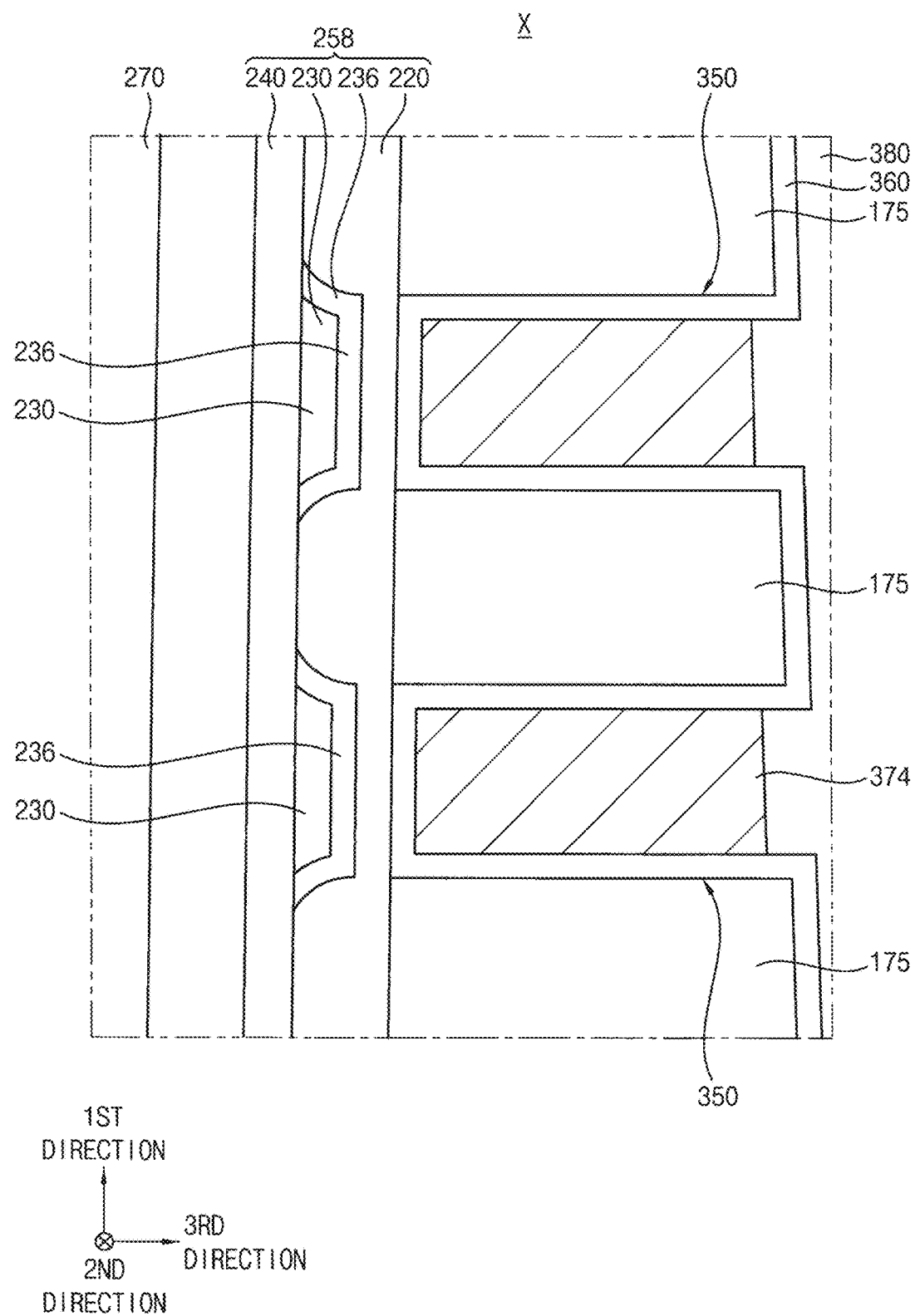
FIG. 23 is a cross-sectional view illustrating a vertical memory device in accordance with some example embodiments, and an enlarged cross-sectional view of the region X of FIG. 1.

FIG. 23 is a cross-sectional view illustrating a vertical memory device in accordance with some example embodiments, and an enlarged cross-sectional view of the region X of FIG. 1. This vertical memory device may be substantially the same as or similar to that of FIG. 17, except for the division pattern and the first blocking pattern.

Referring to FIG. 23, the vertical memory device may include a fourth charge storage structure 258 instead of or in addition to the third charge storage structure 256, and the fourth charge storage structure 258 may include the tunnel insulation pattern 240, the first charge trapping pattern 230, the third charge trapping pattern 236, and the first blocking pattern 220 sequentially stacked in the horizontal direction from the outer sidewall of the channel 260. The first blocking pattern 220 may extend in the first direction to divide each of the first and third charge trapping patterns 230 and 236, and thus may serve as the division pattern 234.

Figure 24:
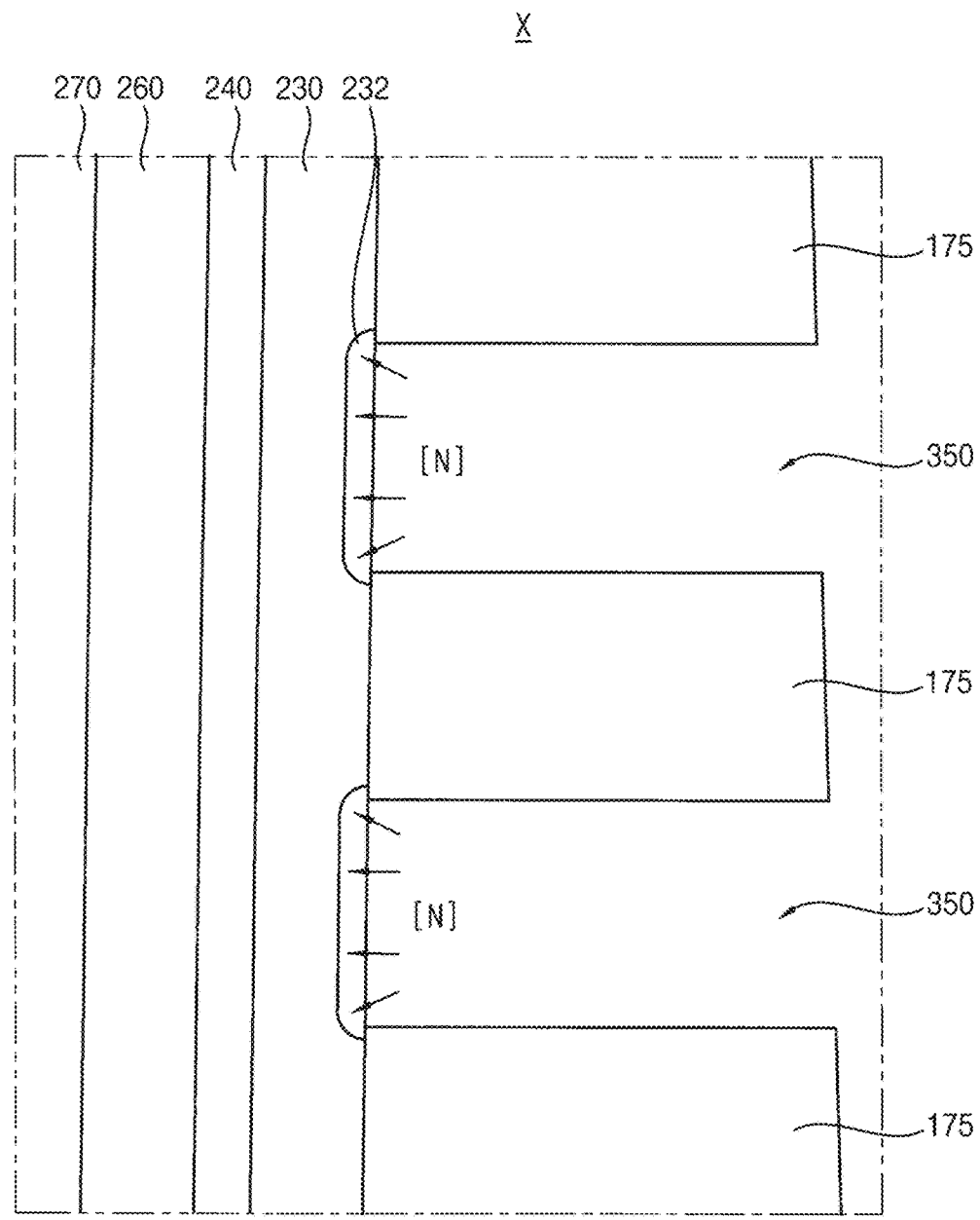
FIGS. 24 to 26 are cross-sectional views, particularly, enlarged cross-sectional views of the region X of FIG. 1 illustrating a method of manufacturing a vertical memory device in accordance with some example embodiments.
Figure 25:
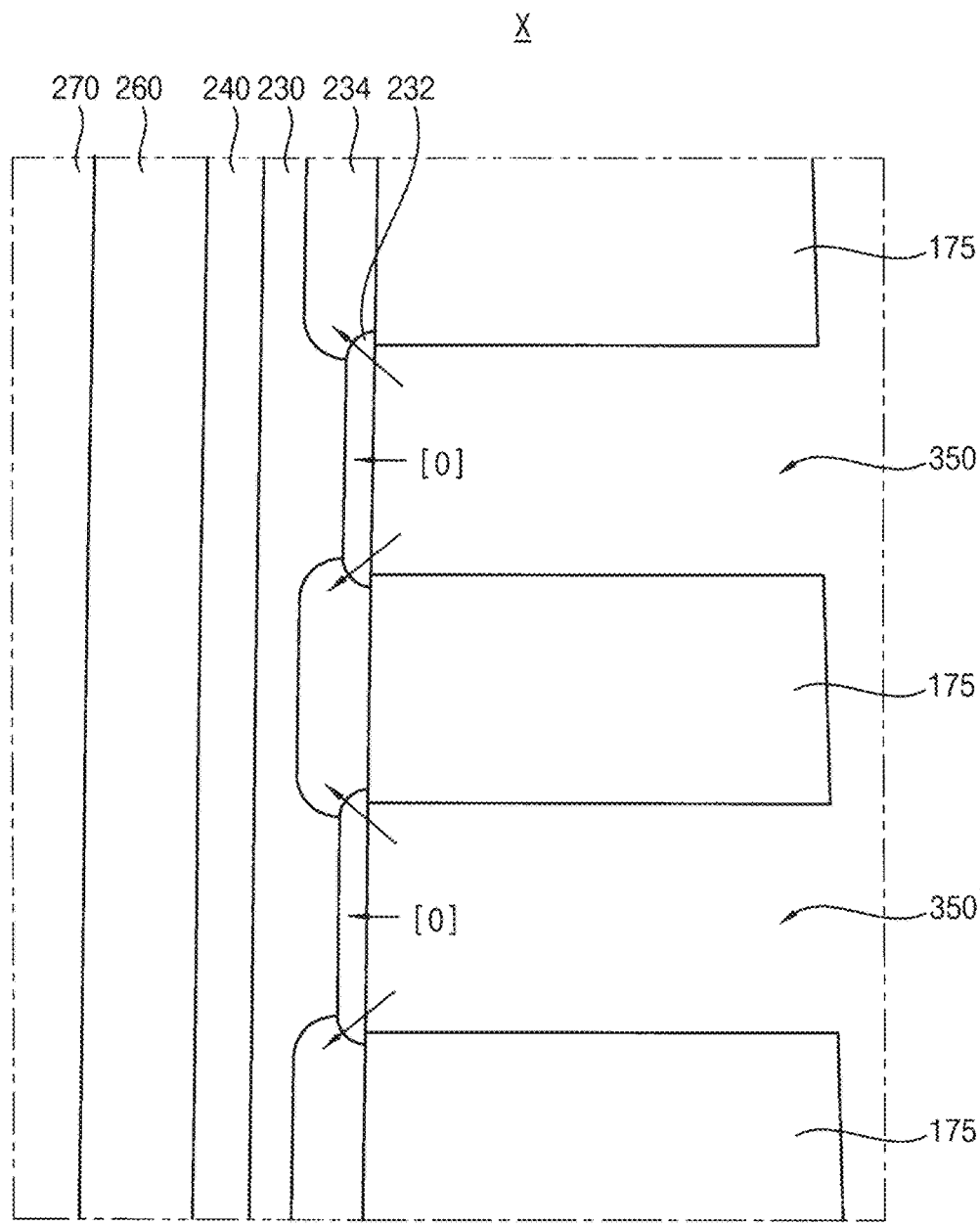
Figure 26:
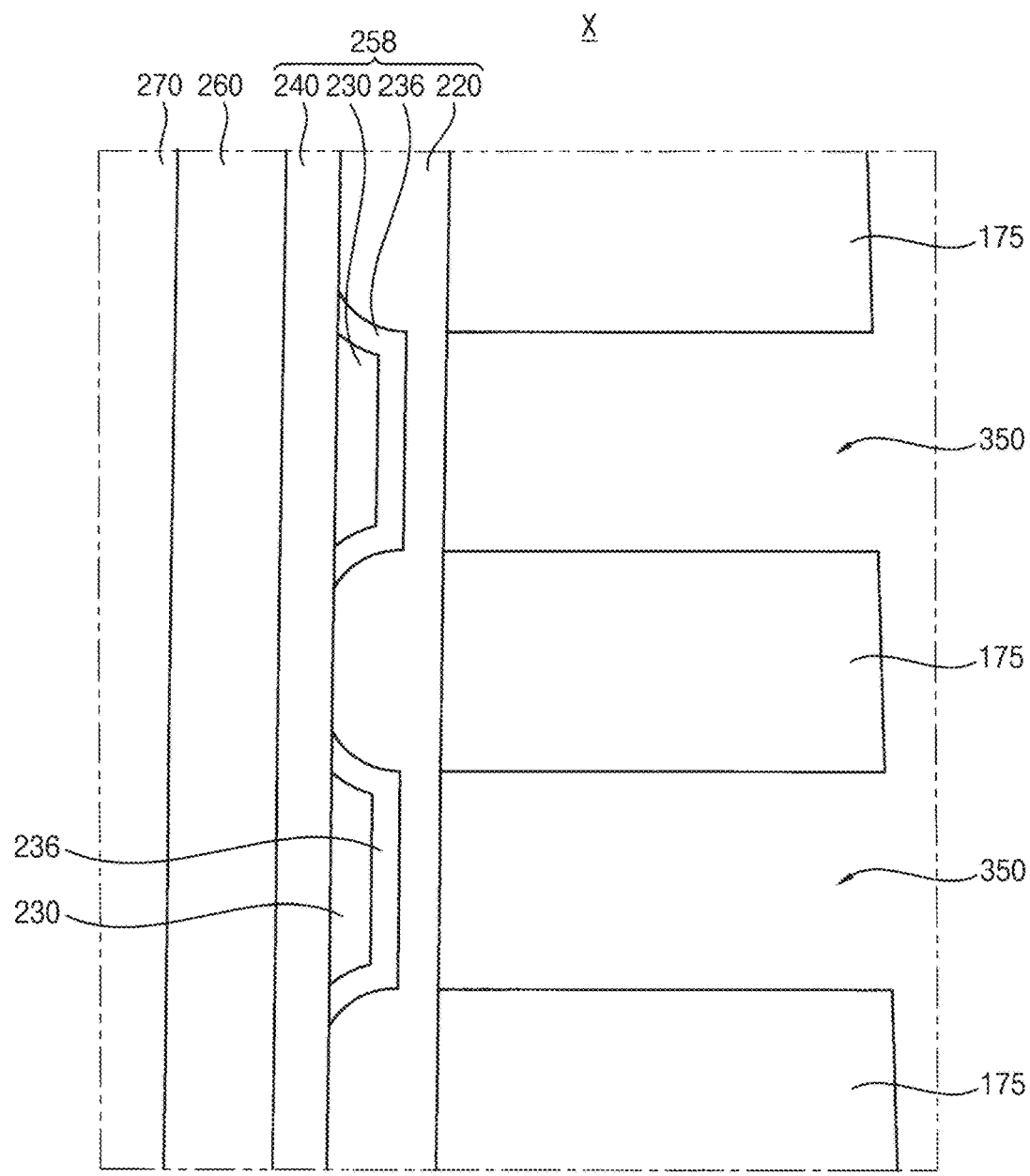

FIGS. 24 to 26 are cross-sectional views, particularly, enlarged cross-sectional views of the region X of FIG. 1 illustrating a method of manufacturing a vertical memory device in accordance with some example embodiments. This method may include processes substantially the same as or similar to those illustrated with reference to FIGS. 18 to 22 and FIG. 17, and thus repetitive descriptions thereon are omitted herein.

Referring to FIG. 24, processes substantially the same as or similar to those illustrated with reference to FIG. 18 may be performed.

However, the preliminary charge storage structure 250 may not include the first blocking pattern 220, and thus the first nitridation process may be performed directly on the preliminary charge trapping pattern 230 not through the first blocking pattern 220. By the first nitridation process, only the portion of the preliminary charge trapping pattern 230 adjacent the second gap 350 may be nitridated to form the charge trapping pattern 232.

Referring to FIG. 25, processes substantially the same as or similar to those illustrated with reference to FIG. 19 may be performed, and thus the portion of the preliminary charge trapping pattern 230 adjacent the insulation pattern 175 may be oxidized to form the division pattern 234.

Referring to FIG. 26, processes substantially the same as or similar to those illustrated with reference to FIGS. 20 and 21 may be performed, so that the first and third charge trapping patterns 230 and 236 spaced apart from each other by the division pattern 234 may be formed.

Processes substantially the same as or similar to those illustrated with reference to FIG. 22 may be performed to form a fourth charge storage structure 258.

For example, a curing process such as a wet etching process may be performed to cure the division pattern 234, and the cured division pattern 234 may serve as the first blocking pattern 220.

Processes substantially the same as or similar to those illustrated with reference to FIG. 11 and FIGS. 1 and 2 may be performed to complete the fabrication of the vertical memory device.

Figure 27:
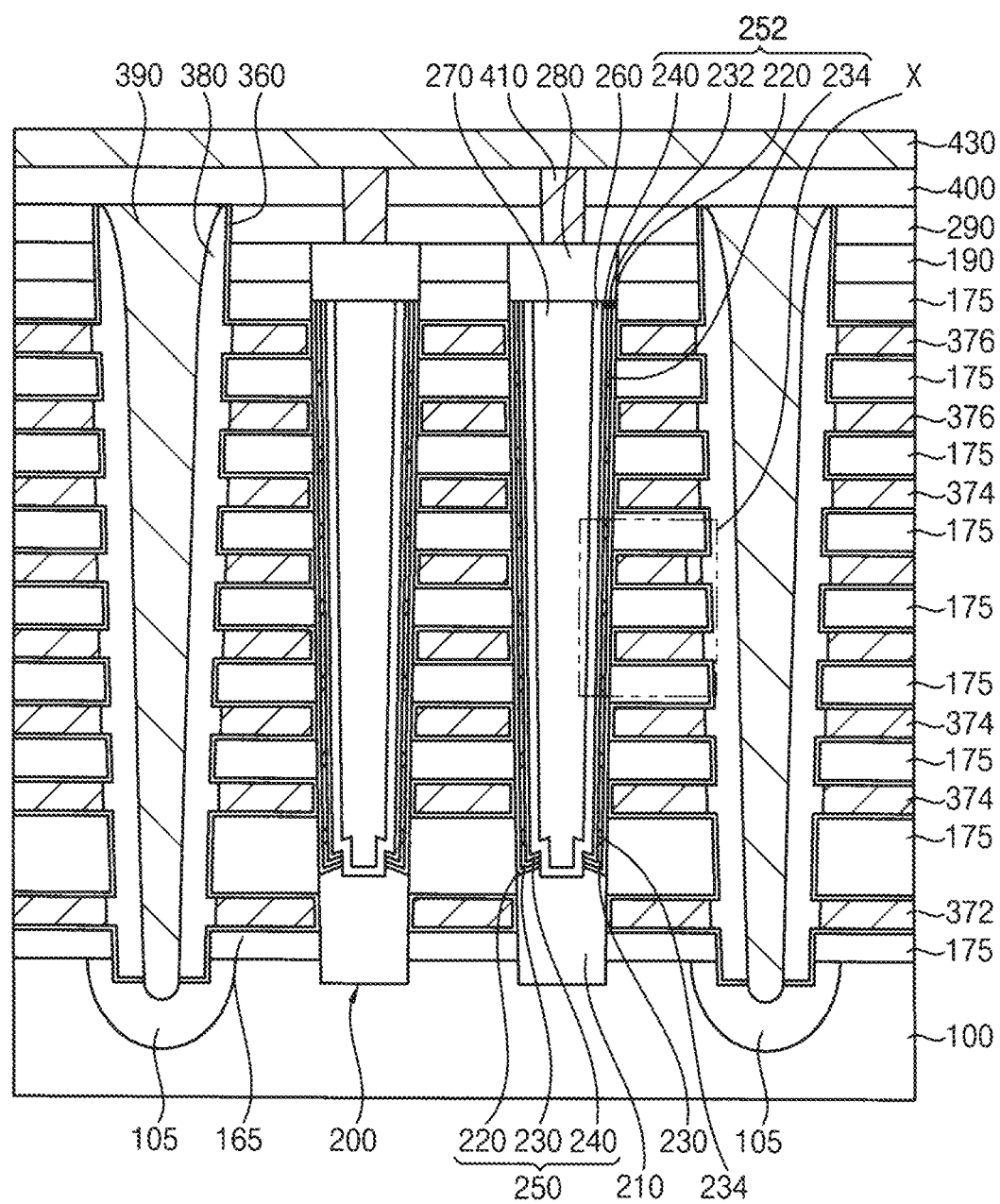
FIG. 27 is a cross-sectional view illustrating a vertical memory device in accordance with some example embodiments.

FIG. 27 is a cross-sectional view illustrating a vertical memory device in accordance with some example embodiments. This vertical memory device may be substantially the same as or similar to that of FIGS. 1 and 2, except for the channel, the dummy charge storage structure, and the gate electrode.

Referring to FIG. 27, the vertical memory device may not include the dummy charge storage structure 250, the channel connection pattern 330, the support layer 160 and the support pattern 165, unlike that of FIGS. 1 and 2.

Meanwhile, a semiconductor pattern 210 may be formed in a lower portion of the channel hole 200, and the channel 260 and the first charge storage structure 252 may be formed on the semiconductor pattern 210.

The first gate electrode 372 may surround a sidewall of the semiconductor pattern 210, and each of the second and third gate electrodes 374 and 376 may surround an outer sidewall of the first charge storage structure 252.

FIG. 27 shows that the vertical memory device includes the first charge storage structure 252, however, the inventive concept may not be limited thereto, and may include one of the second to fourth charge storage structures 254, 256 and 258.

Figure 28:
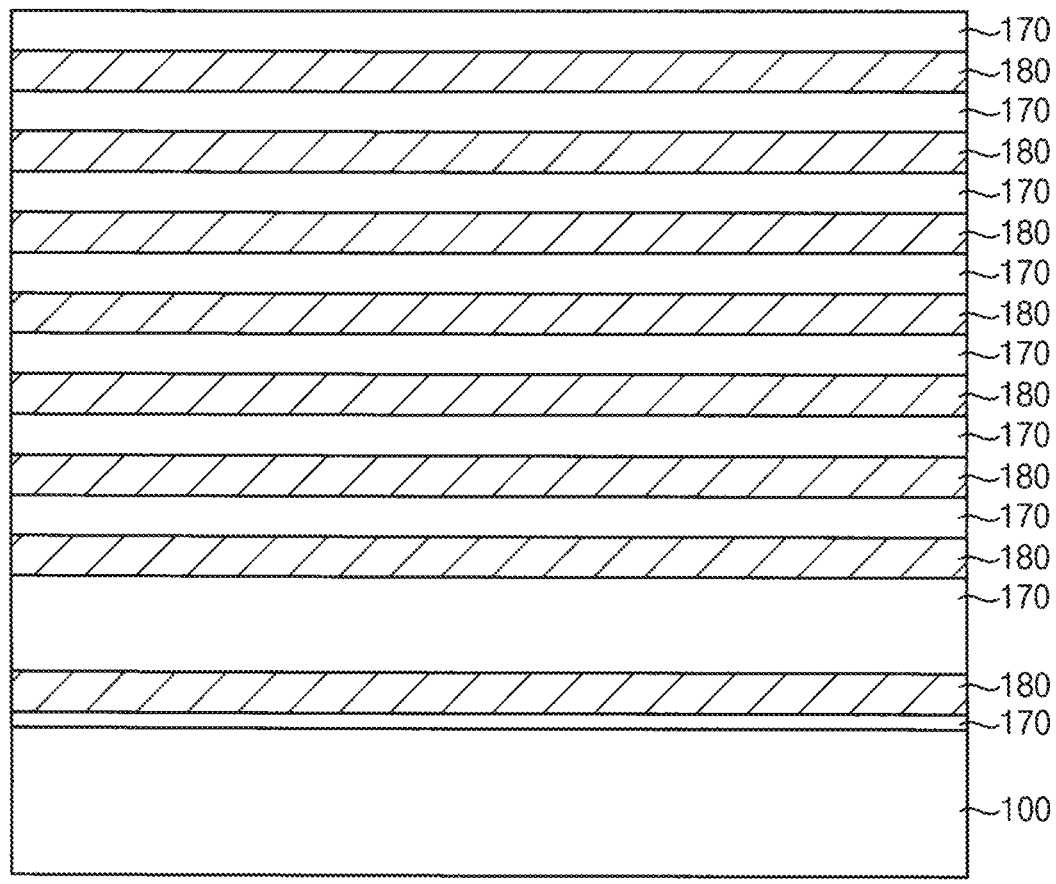
FIGS. 28 to 30 are cross-sectional views illustrating a vertical memory device in accordance with some example embodiments.
Figure 28:
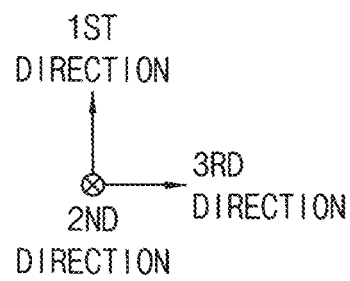
Figure 29:
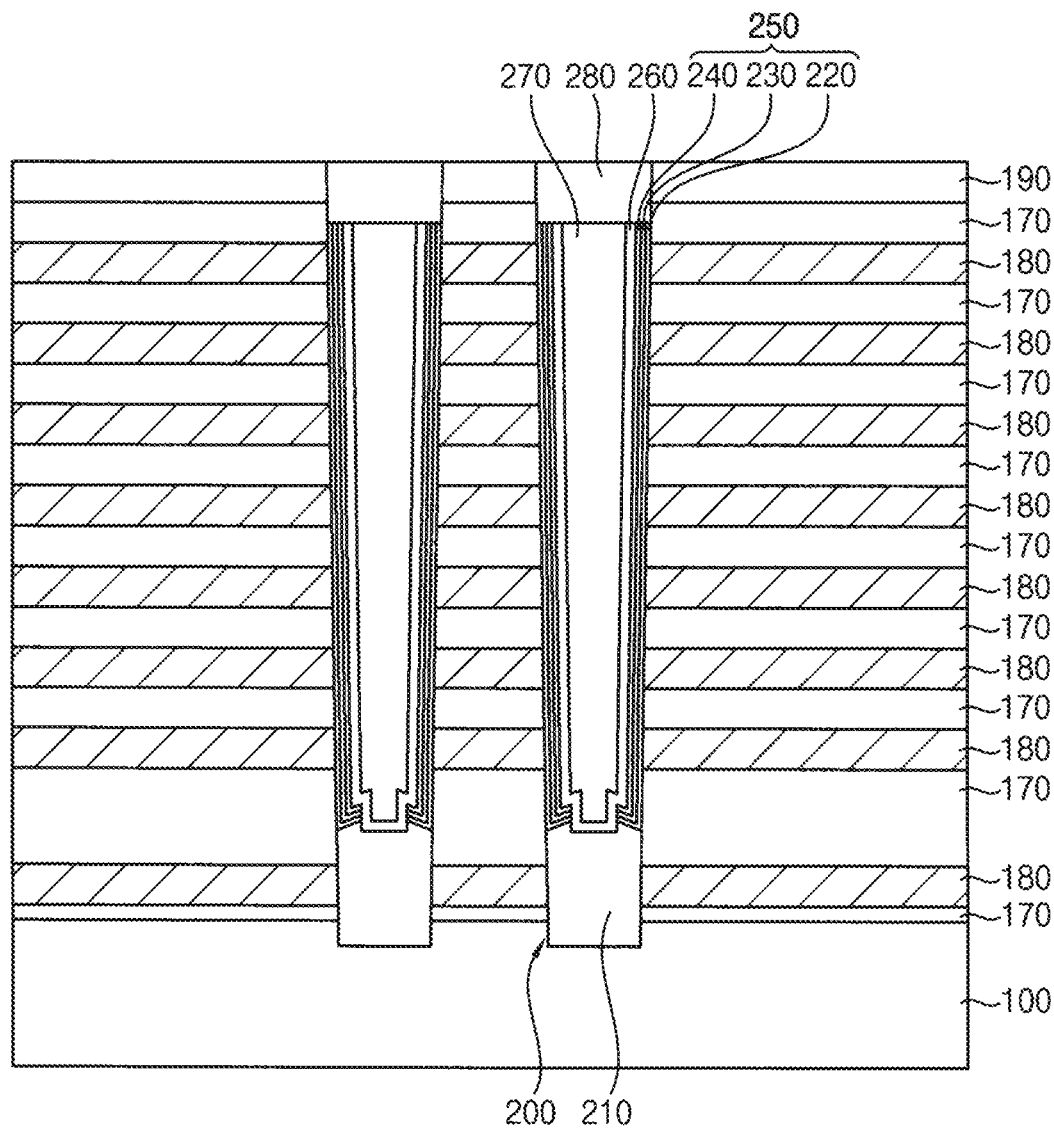
Figure 29:
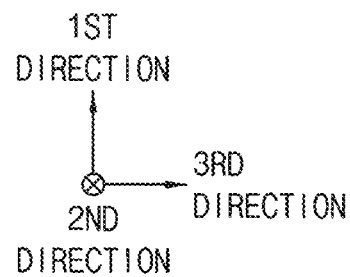
Figure 30:
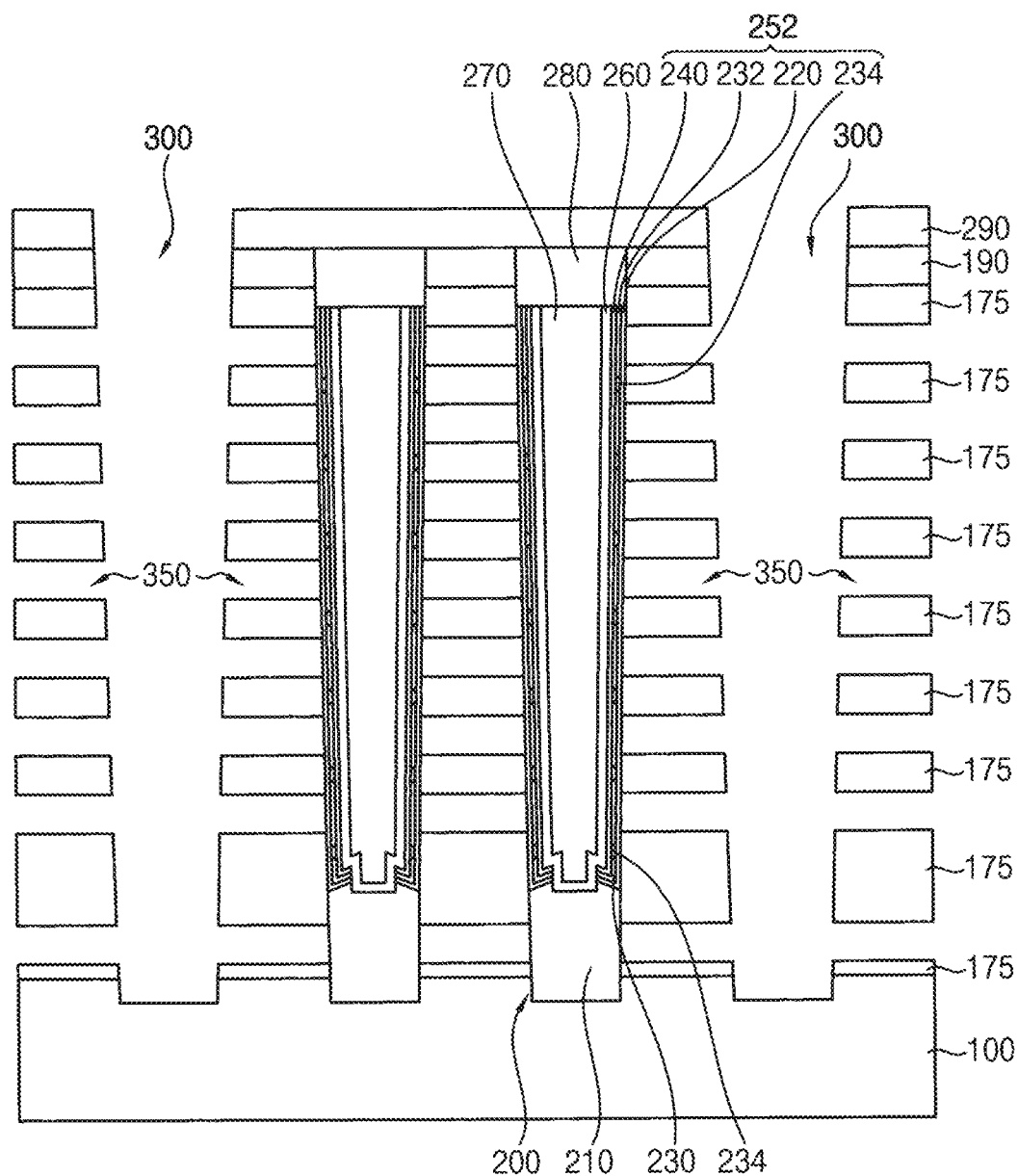

FIGS. 28 to 30 are cross-sectional views illustrating a vertical memory device in accordance with some example embodiments.

Referring to FIG. 28, processes substantially the same as or similar to those illustrated with reference to FIG. 3 may be performed. However, the sacrificial layer structure 140, the support layer 160 and the support pattern 165 may not be formed on the substrate 100, and the mold including the insulation layer 170 and the fourth sacrificial layer 180 alternately and repeatedly stacked may be formed on the substrate 100.

Referring to FIG. 29, processes substantially the same as or similar to those illustrated with reference to FIG. 4 may be performed. However, a semiconductor pattern 210 may be formed by a selective epitaxial growth (SEG) process to fill a lower portion of the channel hole 200, and the preliminary charge storage structure 250, the channel 260, the filling pattern 270, and the pad 280 may be formed on the semiconductor pattern 210 to fill the channel hole 200.

Referring to FIG. 30, processes substantially the same as or similar to those illustrated with reference to FIGS. 5 to 8 may be performed. However, the channel connection pattern 330 may not be formed on the substrate 100, and the fourth sacrificial pattern 185 exposed by the second opening 300 may be removed to form the second gap 350 exposing the preliminary charge storage structure 250 and the semiconductor pattern 210.

Referring to FIG. 27 again, processes substantially the same as or similar to those illustrated with reference to FIGS. 9 to 11 and FIGS. 1 and 2 may be performed to complete the fabrication of the vertical memory device.

While example embodiments have been particularly shown and described, it will be understood by one of ordinary skill in the art that variations in form and detail may be made therein without departing from the spirit and scope of the claims.

What is claimed is:

1. A method of manufacturing a vertical memory device, the method comprising:

forming a mold on a substrate, the mold including an insulation layer and a first sacrificial layer that are alternately and repeatedly stacked;

forming a channel and a preliminary charge storage structure on the substrate, the channel extending through the mold, and the preliminary charge storage structure covering an outer sidewall of the channel and including a tunnel insulation pattern, a preliminary charge trapping pattern, and a first blocking pattern that are sequentially stacked;

forming an opening through the mold to expose an upper surface of the substrate;

removing the first sacrificial layer through the opening to form a first gap exposing an outer sidewall of the preliminary charge storage structure;

performing a first nitridation process on the preliminary charge trapping pattern through the first gap to form charge trapping patterns spaced apart from each other in a vertical direction that is perpendicular to the upper surface of the substrate;

performing a first oxidation process on the preliminary charge trapping pattern through the first gap to form a division pattern between the charge trapping patterns; and forming a gate electrode in the first gap.

2. The method of claim 1, wherein the preliminary charge trapping pattern includes at least one of silicon carbonitride, silicon boronitride, silicon, or silicon doped with nitrogen or carbon, and the charge trapping pattern includes silicon nitride.

3. The method of claim 1, wherein the preliminary charge trapping pattern includes at least one of silicon carbonitride, silicon boronitride, silicon, or silicon doped with at least one of nitrogen or carbon, and the division pattern includes silicon oxide.

4. The method of claim 1, wherein the first nitridation process converts a first portion of the preliminary charge trapping pattern into each of the charge trapping patterns, the first portion facing the first gap in a horizontal direction that is parallel to the upper surface of the substrate, and wherein the first oxidation process converts a second portion of the preliminary charge trapping pattern into the division pattern, the second portion facing the insulation layer in the horizontal direction.

5. The method of claim 1, wherein the first nitridation process converts a first portion of the preliminary charge trapping pattern into each of the charge trapping patterns, the first portion facing the first gap in a horizontal direction parallel to the upper surface of the substrate and adjacent the first blocking pattern, wherein the first oxidation process converts a second portion of the preliminary charge trapping pattern into the division pattern, the second portion facing the insulation layer in the horizontal direction, and wherein the method further comprises, after the first oxidation process, performing a second nitridation process on a third portion of the preliminary charge trapping pattern, the third portion not being converted into the charge trapping patterns.

6. The method of claim 5, wherein the second nitridation process converts upper and lower ends of the third portion of the preliminary charge trapping pattern into the charge trapping patterns.

7. The method of claim 5, further comprising, after the second nitridation process, performing a second oxidation process on the first blocking pattern through the first gap.

8. The method of claim 1, wherein the preliminary storage structure is converted into a charge storage structure by forming the division pattern, wherein the method further comprises, prior to forming the gate electrode in the first gap, forming a second blocking pattern on an inner wall of the first gap and the exposed outer sidewall of the charge storage structure, and wherein the forming the gate electrode includes forming the gate electrode in a remaining portion of the first gap including the second blocking pattern.

9. The method of claim 1, further comprising, prior to forming the mold on the substrate, forming a second sacrificial layer on the substrate, wherein the method further comprises, prior to forming the first sacrificial layer, removing the second sacrificial layer to form a second gap exposing an outer sidewall of the preliminary charge storage structure, removing the exposed preliminary charge storage structure to expose an outer sidewall of the channel, and forming a channel connection pattern to fill the second gap.

10. A method of manufacturing a vertical memory device, the method comprising:

forming a mold on a substrate, the mold including an insulation layer and a sacrificial layer that are alternately and repeatedly stacked;

forming a channel and a preliminary charge storage structure on the substrate, the channel extending through the mold, and the preliminary charge storage structure covering an outer sidewall of the channel and including a tunnel insulation pattern, a preliminary charge trapping pattern, and a first blocking pattern that are sequentially stacked;

forming an opening through the mold to expose an upper surface of the substrate;

removing the sacrificial layer through the opening to form a gap exposing an outer sidewall of the preliminary charge storage structure;

performing a first nitridation process on the preliminary charge trapping pattern through the gap to form oxidation reduction patterns spaced apart from each other in a vertical direction that is perpendicular to the upper surface of the substrate;

performing a first oxidation process on the preliminary charge trapping pattern through the gap to form a preliminary division pattern between the oxidation reduction patterns;

performing a second oxidation process on the oxidation reduction patterns and the preliminary charge trapping pattern through the gap to divide the preliminary charge trapping pattern into a plurality of pieces spaced apart from each other in the vertical direction;

performing a second nitridation process on each of the preliminary charge trapping patterns through the gap to form a charge trapping pattern at lower and upper ends and an outer sidewall of each of the preliminary charge trapping patterns; and forming a gate electrode in the gap.

11. The method of claim 10, wherein the preliminary charge trapping pattern includes at least one of silicon carbonitride, silicon boronitride, silicon, or silicon doped with nitrogen or carbon, and each of the oxidation reduction patterns includes silicon nitride.

12. The method of claim 10, wherein the forming the oxidation reduction patterns includes forming each of the oxidation reduction patterns formed at a first portion of the preliminary charge trapping pattern facing the gap in a horizontal direction that is parallel to the upper surface of the substrate and adjacent the first blocking pattern.

13. The method of claim 12, wherein the forming the preliminary division pattern includes forming the preliminary division pattern at a second portion of the preliminary charge trapping pattern facing the insulation layer in the horizontal direction and adjacent the first blocking pattern.

14. The method of claim 10, further comprising, after the second nitridation process, performing a third oxidation process on the first blocking pattern through the gap so that the division pattern includes a material substantially the same as that of the first blocking pattern.

15. The method of claim 10, wherein the second nitridation process converts the preliminary charge storage structure is converted into a charge storage structure ,
wherein the method further comprises, prior to forming the gate electrode in the gap, forming a second blocking pattern on an inner wall of the gap and the exposed outer sidewall of the charge storage structure, and
wherein the gate electrode is formed in a remaining portion of the gap including the second blocking pattern.

16. A method of manufacturing a vertical memory device, the method comprising:
forming a mold on a substrate, the mold including an insulation layer and a sacrificial layer that are alternately and repeatedly stacked;
forming a channel and a preliminary charge storage structure on the substrate, the channel extending through the mold, and the preliminary charge storage structure covering an outer sidewall of the channel and including a tunnel insulation pattern and a preliminary charge trapping pattern that are sequentially stacked;
forming an opening through the mold to expose an upper surface of the substrate;
removing the sacrificial layer through the opening to form a gap exposing an outer sidewall of the preliminary charge storage structure;
performing a first nitridation process on the preliminary charge trapping pattern through the gap to form oxidation reduction patterns spaced apart from each other in a vertical direction perpendicular to the upper surface of the substrate;
performing a first oxidation process on the preliminary charge trapping pattern through the gap to form a preliminary division pattern between the oxidation reduction patterns;
performing a second oxidation process on the oxidation reduction patterns and the preliminary charge trapping pattern through the gap to divide the preliminary charge trapping pattern into a plurality of pieces spaced apart from each other in the vertical direction;
performing a second nitridation process on each of the preliminary charge trapping patterns through the gap to form a charge trapping pattern at lower and upper ends and an outer sidewall of each of the preliminary charge trapping patterns; and
forming a gate electrode in the gap.

17. The method of claim 16, wherein the forming the oxidation reduction pattern includes forming each of the oxidation reduction pattern at a first portion of the preliminary charge trapping pattern adjacent the gap.

18. The method of claim 17, wherein the forming the preliminary division pattern includes forming the preliminary division pattern at a second portion of the preliminary charge trapping pattern adjacent the insulation layer.

19. The method of claim 18, wherein the second oxidation process oxidizes the oxidation reduction patterns and a third portion of the preliminary charge trapping pattern adjacent the preliminary division pattern in a horizontal direction that is parallel to the upper surface of the substrate to form a division pattern extending in the vertical direction and covering an outer sidewall and upper and lower surfaces of each of the preliminary charge trapping patterns.

20. The method of claim 19, further comprising, after the second nitridation process, performing a third oxidation process on the division pattern through the gap so that the division pattern serves as a blocking pattern.

* * * * *